United States Patent
Armstrong-Crews et al.

(10) Patent No.: US 12,117,520 B1
(45) Date of Patent: Oct. 15, 2024

(54) METHODS AND SYSTEMS FOR RADAR IMAGE VIDEO COMPRESSION USING PER-PIXEL DOPPLER MEASUREMENTS

(71) Applicant: Waymo LLC, Mountain View, CA (US)

(72) Inventors: Nicholas Armstrong-Crews, Mountain View, CA (US); Filip Perich, Mountain View, CA (US); Timothy Campbell, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 583 days.

(21) Appl. No.: 17/370,285

(22) Filed: Jul. 8, 2021

(51) Int. Cl.
*G01S 13/89* (2006.01)
*B60W 60/00* (2020.01)
*G01S 7/41* (2006.01)
*G06T 7/00* (2017.01)
*G06T 7/246* (2017.01)

(52) U.S. Cl.
CPC ............. *G01S 13/89* (2013.01); *G01S 7/415* (2013.01); *G06T 7/246* (2017.01); *G06T 7/97* (2017.01); *B60W 60/001* (2020.02); *B60W 2420/408* (2024.01); *B60W 2520/14* (2013.01); *G06T 2207/10044* (2013.01); *G06T 2207/30248* (2013.01)

(58) Field of Classification Search
CPC ......... G01S 13/89; G01S 7/415; G06T 7/246; G06T 7/97; G06T 2207/10044; G06T 2207/30248; B60W 60/001; B60W 2420/52; B60W 2520/14
See application file for complete search history.

(56) References Cited

U.S. PATENT DOCUMENTS

| | | | |
|---|---|---|---|
| 5,734,754 | A | 3/1998 | Parker |
| 6,078,281 | A | 6/2000 | Milkovich et al. |
| 7,397,851 | B2 | 7/2008 | Roman |
| 7,535,412 | B1 | 5/2009 | Blunt et al. |

(Continued)

FOREIGN PATENT DOCUMENTS

| | | | |
|---|---|---|---|
| GB | 2474326 B | 12/2011 | |
| WO | WO-2020198121 A1 * | 10/2020 | ...... B60W 60/00272 |

*Primary Examiner* — Vladimir Magloire
*Assistant Examiner* — David C. Schultz
(74) *Attorney, Agent, or Firm* — McDonnell Boehnen Hulbert & Berghoff LLP

(57) ABSTRACT

Example embodiments relate to radar image video compression techniques using per-pixel Doppler measurements, which can involve initially receiving radar data from a radar unit to generate a radar representation that represents surfaces in the environment. Based on Doppler scores in the radar representation, a range rate can be determined for each pixel that indicates a radial direction motion for a surface represented by the pixel. The range rates and backscatter values can then be used to estimate a radar representation prediction for subsequent radar data received from the radar unit, which enables a generation of a compressed radar data file that represents the difference between the radar representation prediction and the actual representation determined for the subsequent radar data. The compressed radar data file can be stored in memory, transmitted to other devices, and decompressed and used to train models via machine learning.

20 Claims, 10 Drawing Sheets

(56) References Cited

U.S. PATENT DOCUMENTS

| | | | |
|---|---|---|---|
| 7,696,920 B1 | 4/2010 | Finley et al. | |
| 8,044,846 B1 | 10/2011 | Urkowitz et al. | |
| 8,537,898 B2 | 9/2013 | Roman | |
| 9,448,300 B2 * | 9/2016 | Jansen | G01S 13/34 |
| 10,234,553 B2 * | 3/2019 | Stainvas Olshansky | G01S 13/89 |
| 10,261,179 B2 * | 4/2019 | Davis | G01S 13/87 |
| 10,609,148 B1 * | 3/2020 | Tran | G06Q 50/40 |
| 2010/0104199 A1 * | 4/2010 | Zhang | G08G 1/166 382/199 |
| 2012/0326920 A1 | 12/2012 | Crisler | |
| 2016/0366330 A1 * | 12/2016 | Boliek | G11B 27/005 |
| 2017/0054449 A1 * | 2/2017 | Mani | G01S 7/352 |
| 2017/0332095 A1 * | 11/2017 | Zou | H04N 19/537 |
| 2020/0082248 A1 * | 3/2020 | Villegas | G06N 3/044 |
| 2020/0097841 A1 * | 3/2020 | Petousis | H03M 7/6023 |
| 2021/0063200 A1 * | 3/2021 | Kroepfl | C03C 17/3644 |
| 2021/0208236 A1 * | 7/2021 | John Wilson | G06N 3/08 |

\* cited by examiner

METHODS AND SYSTEMS FOR RADAR IMAGE VIDEO COMPRESSION USING PER-PIXEL DOPPLER MEASUREMENTS

BACKGROUND

In signal processing, data compression involves encoding information using fewer bits than the original representation. Any particular data compression is either lossy or lossless. Lossless compression reduces bits by identifying and eliminating statistical redundancy with no information lost during lossless compression. Lossy compression reduces bits by removing unnecessary or less important information. In some applications, an encoder is the device used to perform the data compression while a decoder is the device used to perform the reversal of the process (decompression).

Compression can reduce the resources required to store and transmit data. Computational resources are consumed in the compression and decompression processes with data compression being subject to a space-time complexity trade-off. For instance, a compression scheme for video may require expensive hardware for the video to be decompressed fast enough to be viewed as it is being decompressed, and the option to decompress the video in full before watching it may be inconvenient or require additional storage.

SUMMARY

Example embodiments describe radar image video compression techniques that use per-pixel Doppler measurements for partial frame prediction. Such compression techniques enable radar video data to be reduced into compressed radar files that can be efficiently stored locally in memory on a vehicle and also communicated between local computing systems on the vehicle as well with other systems (e.g., a remote server). In some applications, radar data compressed during vehicle navigation can be subsequently decompressed and used to develop models via machine learning, which can efficiently improve radar development and performance.

In one aspect, an example method is provided. The method involves receiving first radar data from a radar unit coupled to a vehicle operating in an environment and generating, by a computing device, a first radar representation that includes first pixels representing surfaces in the environment based on the first radar data. Each first pixel includes a Doppler score and a backscatter value. The method further involves, for each first pixel, determining a range rate based on a Doppler score for the first pixel. The range rate indicates a radial direction motion for a surface represented by the first pixel. The method also involves estimating a radar representation prediction for second radar data received from the radar unit based on respective range rates and backscatter values for the first pixels. The second radar data is received subsequent to the first radar data. The method further involves generating a compressed radar data file based on a difference between the radar representation prediction and a second radar representation. The second representation is generated based on the second radar data and includes second pixels representing surfaces in the environment. The method also involves storing the compressed radar data file.

In another aspect, an example system is provided. The system includes a radar unit coupled to a vehicle and a computing device. The computing device is configured to receive first radar data from the radar unit and generate a first radar representation that includes first pixels representing surfaces in an environment based on the first radar data. Each first pixel includes a Doppler score and a backscatter value. For each first pixel, the computing device is configured to determine a range rate based on a Doppler score for the first pixel where the range rate indicates a radial direction motion for a surface represented by the first pixel. The computing device is also configured to estimate a radar representation prediction for second radar data received from the radar unit based on respective range rates and backscatter values for the first pixels. The second radar data is received subsequent to the first radar data. The computing device is also configured to generate a compressed radar data file based on a difference between the radar representation prediction and a second radar representation. The second representation is generated based on the second radar data and includes second pixels representing surfaces in the environment. The computing device is also configured to store the compressed radar data file.

In yet another example, an example non-transitory computer-readable medium configured to store instructions, that when executed by a computing system comprising one or more processors, causes the computing system to perform operations. The operations involve receiving first radar data from a radar unit coupled to a vehicle operating in an environment and generating a first radar representation that includes first pixels representing surfaces in the environment based on the first radar data. Each first pixel includes a Doppler score and a backscatter value. The operations also involve, for each first pixel, determining a range rate based on a Doppler score for the first pixel. The range rate indicates a radial direction motion for a surface represented by the first pixel. The operations also involve estimating a radar representation prediction for second radar data received from the radar unit based on respective range rates and backscatter values for the first pixels. The second radar data is received subsequent to the first radar data. The operations further involve generating a compressed radar data file based on a difference between the radar representation prediction and a second radar representation and storing the compressed radar data file. The second representation is generated based on the second radar data and includes second pixels representing surfaces in the environment.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

Figure 1:
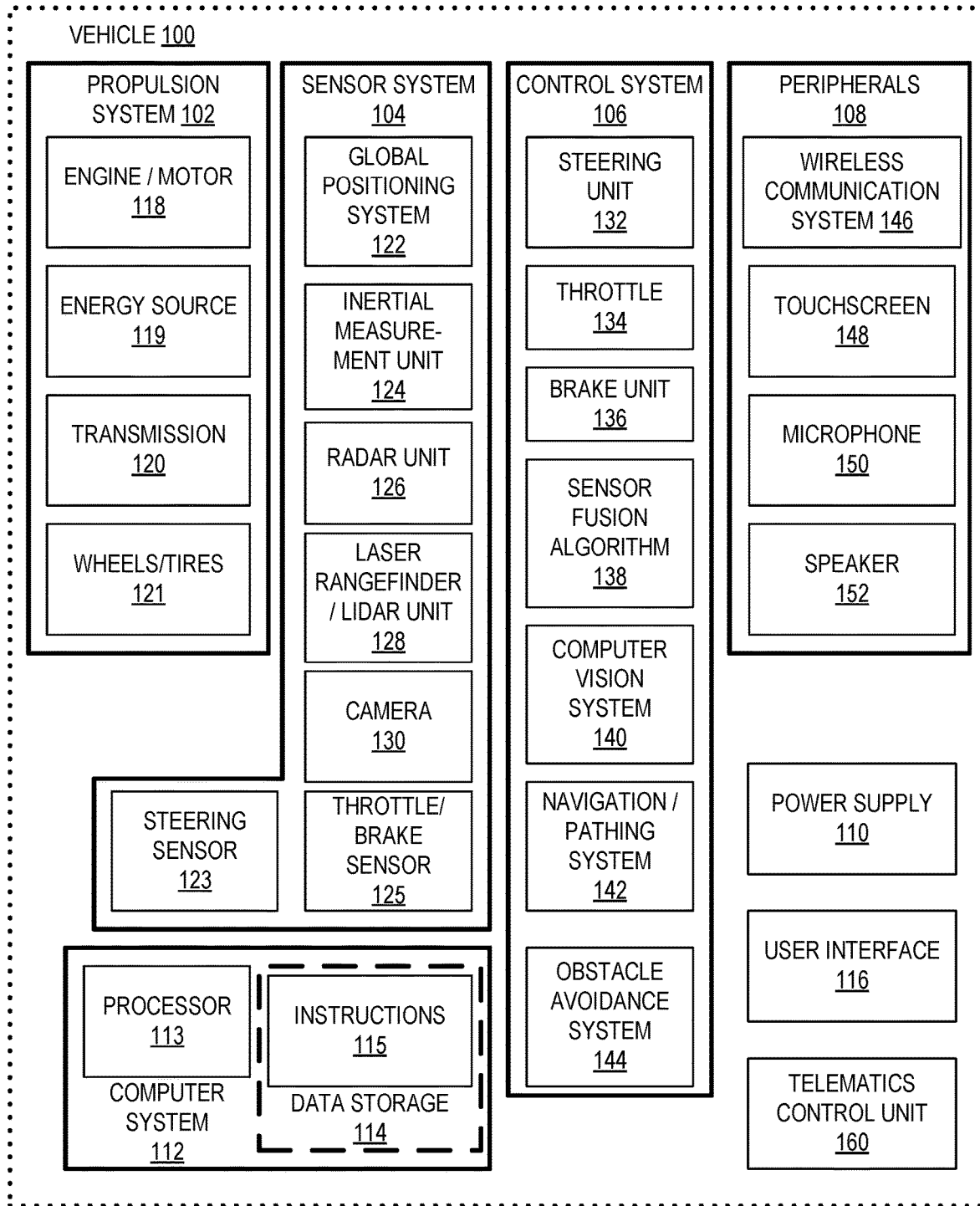
FIG. 1 is a functional block diagram illustrating a vehicle, according to one or more example embodiments.
Figure 2A:
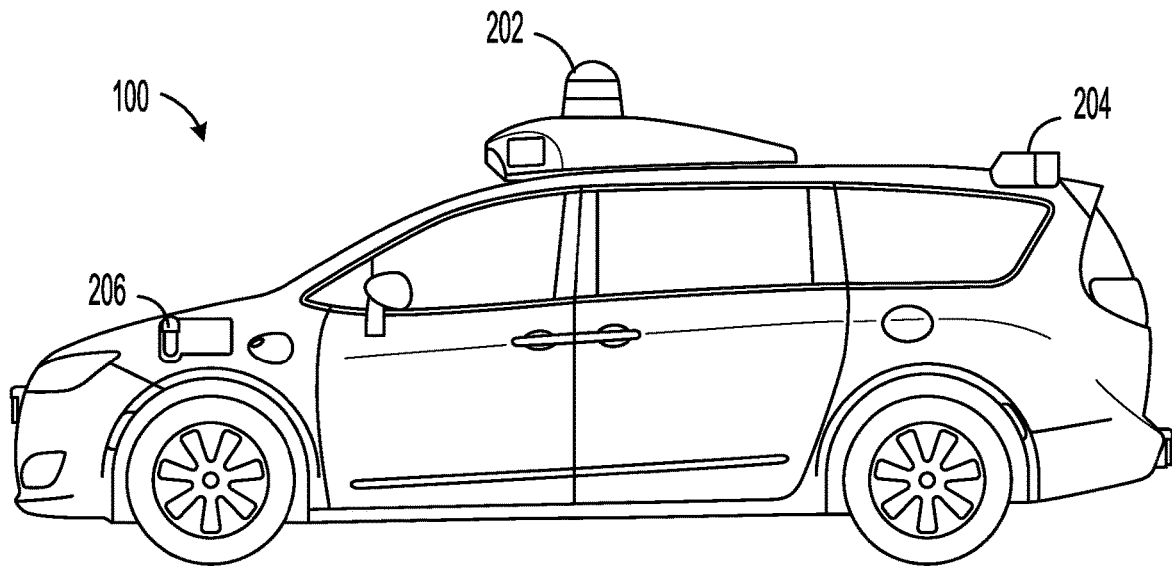
FIG. 2A illustrates a side view of a vehicle, according to one or more example embodiments.
Figure 2B:
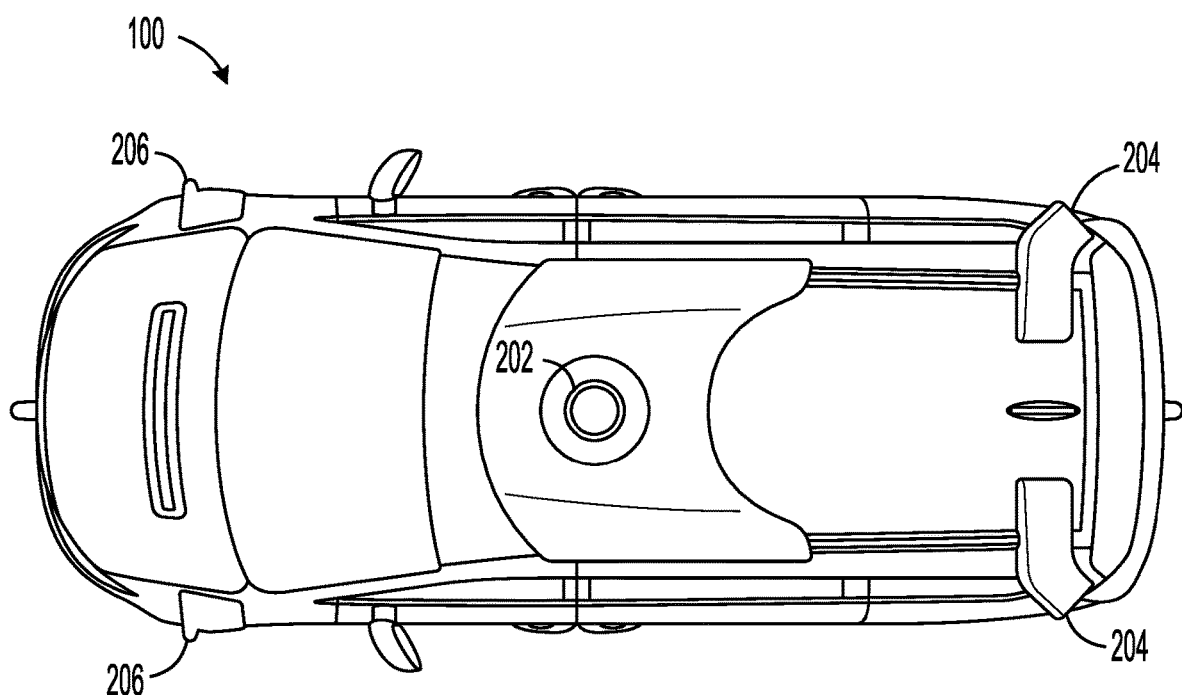
FIG. 2B illustrates a top view of a vehicle, according to one or more example embodiments.
Figure 2C:
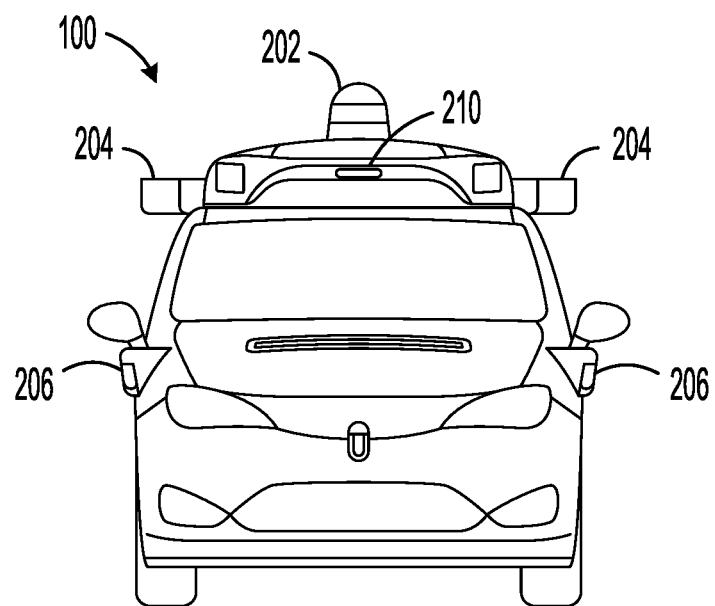
FIG. 2C illustrates a front view of a vehicle, according to one or more example embodiments.
Figure 2D:
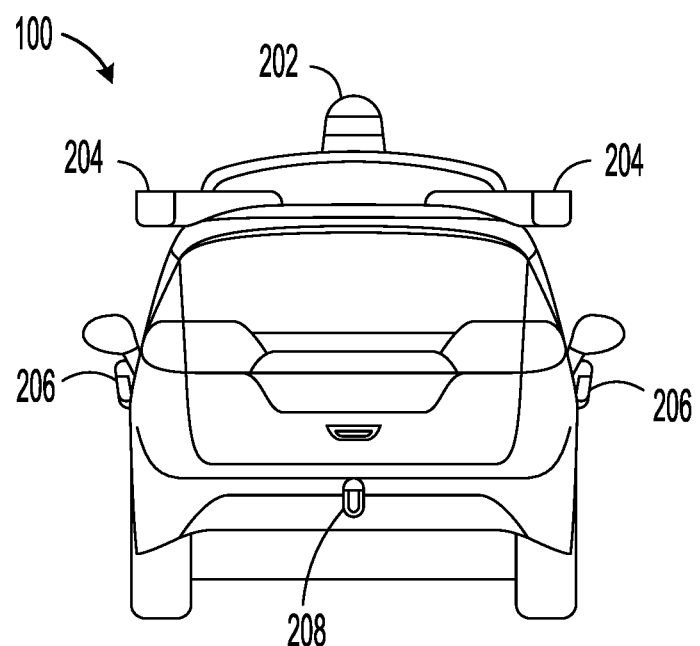
FIG. 2D illustrates a back view of a vehicle, according to one or more example embodiments.
Figure 2E:
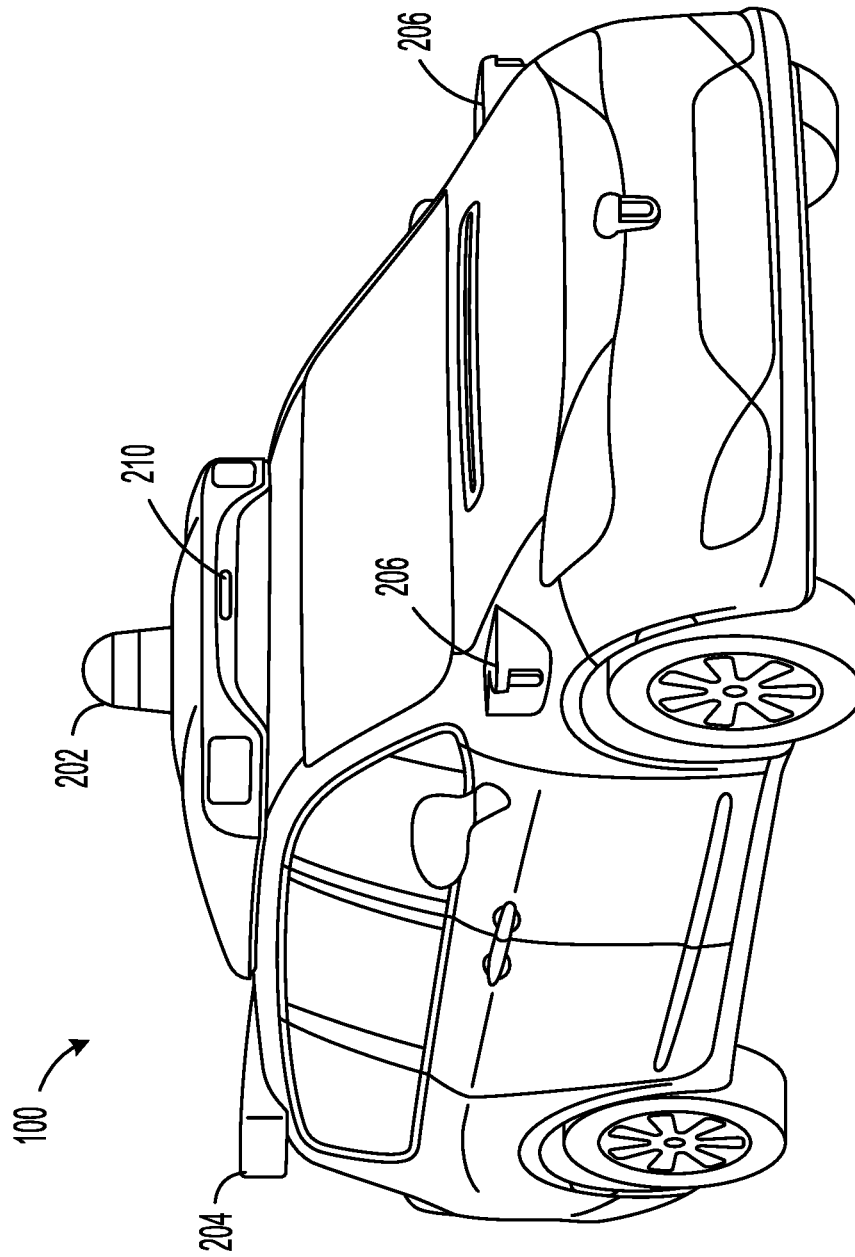
FIG. 2E illustrates an additional view of a vehicle, according to one or more example embodiments.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Standard image compression techniques often involve identifying differences between sequential image frames and compressing these differences. Since sequential image frames are often highly correlated, the cumulative difference between a pair of image frames can have a lot less information to store overall. For instance, the cumulative difference between sequential images in a video can often consist of mainly zeros because there is little to no change for most pixels between these image frames.

More advanced image compression techniques can involve identifying local motion in image patches (portions of an image) from one image frame to the next image frame. Also referred to as optical flow, this identified local motion can be used to predict what the next image frame should look like. In practice, a compression system may estimate the optical flow between a pair of sequential image frames (i.e., between frame (t−1) and frame (t)) and, under an assumption that the optical flow remains constant up to frame (t+1), use the optical flow to predict the next image frame. Now, instead of compressing the difference between measured frame (t) and frame (t+1) (as performed in the standard image compression techniques described above), the difference can be computed between the predicted frame (t+1) and a measured frame at t+1 (i.e., frame (t+1)). The prediction step can provide a more accurate motion model than the implicit "no motion" model used in standard image compression techniques. As a result, advanced image compression techniques can produce a "difference image" with more zeros that can compress more effectively than the compression results achieved via the standard image compression techniques.

Performance of these advanced image compression techniques can have drawbacks. Particularly, inferring local motion from local image patches can prove difficult to accurately perform and can require an inference on pixel-to-pixel data association in the image patches across sequential frames (e.g., frame (t−1) and frame (t)). As a result, the inference process might require extensive computational resources to complete and can also result in mistakes that impact the effectiveness of the algorithm and reduce the end compression ratio. Further, when computation is performed to decompress the video, the cost of inferring optical flow may be paid multiple times (e.g., for a write-once read-many paradigm when reading logs many times for simulation), unless the optical flow is stored along with the determined differences between images (reducing the compression ratio).

Vehicle sensor systems are often configured to capture vast amounts of data from the surrounding environment to enable vehicles to operate fully autonomously or semi-autonomously. Such sensor systems may include various types of sensors, such as cameras, LIDAR, and radar, among others. These sensors contribute information that can be used by vehicle control systems to safely navigate the dynamic environment. As such, data compression techniques are often used to compress sensor data into more manageable sizes that can be efficiently transmitted between different systems on the vehicle. In addition, sensor data may also be compressed and stored for subsequent applications. For instance, stored sensor data can be used to update current sensor software, model training, log data analysis, error detection and correction, and/or for other potential applications. Because vehicle sensors generate large amounts of data during vehicle operations, it is desirable to have efficient data compression techniques to reduce the overall computational resources required.

Example compression techniques presented herein enable efficient radar data compression using backscatter and per-pixel Doppler measurements for partial frame prediction. Such compression techniques can be used to enable efficient transmission of radar data between different processing devices during vehicle operations. For instance, field programmable gate arrays (FPGAs) associated with individual radar antenna arrays may perform disclosed compression techniques (or portions of the techniques in combination with other computing devices) to enable efficient communication of radar information to other vehicle systems, such as a central sensor processing system. In addition, disclosed compression techniques can also enable radar data to be efficiently stored in memory and communicated from the vehicle to servers and other remote devices via wireless communication.

Compressed radar data files can also be decompressed via a decompression process and used for various operations. For instance, vehicle control systems can use the decompressed radar data for vehicle operations. Decompressed radar data can also be offline for model training via machine learning.

Unlike camera images, raw radar imagery contains a direct measurement of the Doppler score for each pixel in the radar data. The Doppler score indicates motion information for a surface in the environment represented by the pixel. Thus, radar data with numerous pixels representing various surfaces in the environment can include corresponding Doppler scores that indicate motions for these surfaces. The signal waveform used to compute Doppler scores can be used to transform the Doppler score for each pixel into a range rate that indicates how quickly an object (surface) represented by that particular pixel is moving toward (or away from) the reception antenna array in the radial direction. The range rates can be expressed either in real-world units of meters per second (m/s) or in image-related units of pixels per frame.

Given the range rate in units of pixels per frame (computed separately for each pixel) and backscatter values for the pixels, example radar compression techniques can enable predictions that indicate where any pixel will likely be in the next radar image within the radar video stream. In some applications, when the radar system uses polar image representations (e.g., pixels within radar data images arranged according to a polar coordinate system), the prediction process for estimating a change for a pixel across sequential radar frames can involve a simple one-dimensional (1D) translation in the radial dimension (e.g., toward or away from the radar array obtaining measurements) based on the range rates and prior backscatter values for pixels.

In addition, disclosed radar video compression techniques may also be implemented without a reliance on the patch-based matching process used in advanced camera image compression. Rather, an example technique can use the available Doppler information to perform computationally inexpensive compression, which can be executed on-chip embedded in the radar without requiring an expensive, heavy, power-hungry heat-generating video compression hardware accelerator typically used for camera image compression.

In some embodiments, disclosed radar video compression techniques may further involve factoring 2D motion occurring in the environment relative to the vehicle. For instance, an example technique may involve combining the radial motion compression process with an application of a camera-related scheme to infer motion in other dimensions from local patches. This hybrid method can simplify and improve the accuracy of the second step when compared to a conventional full 2D matching process. In addition, some embodiments may involve performing similar operations for 3D information capture that includes range, azimuth angle, and elevation angle information (e.g., 3D data cube).

In some examples, the vehicle's motion can be used as an input to predict the image motion as part of the radar compression technique. Particularly, a processing system can use vehicle motion information from one or more external sources, such as velocity and raw rate from international measurement units (IMUs) and laser scan matching. For example, the yaw rate can correspond directly to a 1D translation of the polar image in the azimuth dimension (or a rotation of the Cartesian image), which enables disclosed compression techniques to incorporate the vehicle's yaw rate measurement into the prediction of the next radar image frame.

Example radar data compression techniques can generate compressed radar data files that can be stored in memory locally onboard vehicles and transmitted to other devices, such as servers and other processing systems. For instance, vehicle systems can perform disclosed compression techniques to generate data logs that can be used to analyze specific trends and/or record the data-based events/actions of the vehicle radar system during operation. In addition, compressed radar data files can be decompressed and used to train models via machine learning or other techniques. Machine learning can involve analyzing data within the decompressed radar data files to build analytical models that can be used to improve subsequent vehicle operation and vehicle radar performance.

In addition, some example radar data compression techniques are performed locally at a radar unit. For example, a field programmable gate array (FPGA) can perform disclosed compression techniques on raw radar data cubes or 2D images produced locally based on radar returns received at the radar unit. The FPGA can then transmit radar data in a compressed format to other vehicle systems for subsequent use. These systems may store the compressed files and/or decompress the files for use in various ways. For example, a vehicle control system may use the decompressed files to determine and perform a vehicle control strategy that factors aspects of the radar measurements.

The following detailed description may be used with one or more radar units having one or multiple antenna arrays. The one or multiple antenna arrays may take the form of a single-input single-output (SISO), single-input, multiple-output (SIMO), multiple-input single-output (MISO), multiple-input multiple-output (MIMO), and/or synthetic aperture radar (SAR) radar antenna architecture. In some embodiments, example radar unit architecture may include a plurality of "dual open-ended waveguide" (DOEWG) antennas. The term "DOEWG" may refer to a short section of a horizontal waveguide channel plus a vertical channel that splits into two parts. Each of the two parts of the vertical channel may include an output port configured to radiate at least a portion of electromagnetic waves that enters the radar unit. Additionally, in some instances, multiple DOEWG antennas may be arranged into one or more antenna arrays.

Some example radar systems may be configured to operate at an electromagnetic wave frequency in the W-Band (e.g., 77 Gigahertz (GHz)), which may correspond to electromagnetic waves on the order of millimeters (e.g., 1 mm or 4 mm). Such antennas may be compact (typically with rectangular form factors), efficient (i.e., with little of the 77 GHz energy lost to heat in the antenna or reflected back into the transmitter electronics), low cost and easy to manufacture (i.e., radar systems with these antennas can be made in high volume). In addition, radar units may have different functionality and operational characteristics. For example, a system may include a radar unit configured for long-range operation and another radar unit configured for short-range operation. A radar system may use a combination of different radar units to measure different areas of the environment.

Referring now to the figures, FIG. 1 is a functional block diagram illustrating vehicle 100, which represents a vehicle capable of operating fully or partially in an autonomous mode. More specifically, vehicle 100 may operate in an autonomous mode without human interaction through receiving control instructions from a computing system (e.g., a vehicle control system). As part of operating in the autonomous mode, vehicle 100 may use sensors (e.g., sensor system 104) to detect and possibly identify objects of the surrounding environment to enable safe navigation. In some example embodiments, vehicle 100 may also include subsystems that enable a driver (or a remote operator) to control operations of vehicle 100.

As shown in FIG. 1, vehicle 100 includes various subsystems, such as propulsion system 102, sensor system 104, control system 106, one or more peripherals 108, power supply 110, computer system 112, data storage 114, and user interface 116. The subsystems and components of vehicle 100 may be interconnected in various ways (e.g., wired or secure wireless connections). In other examples, vehicle 100 may include more or fewer subsystems. In addition, the functions of vehicle 100 described herein can be divided into additional functional or physical components, or combined into fewer functional or physical components within implementations.

Propulsion system 102 may include one or more components operable to provide powered motion for vehicle 100 and can include an engine/motor 118, an energy source 119, a transmission 120, and wheels/tires 121, among other possible components. For example, engine/motor 118 may be configured to convert energy source 119 into mechanical energy and can correspond to one or a combination of an internal combustion engine, one or more electric motors, steam engine, or Stirling engine, among other possible options. For instance, in some implementations, propulsion system 102 may include multiple types of engines and/or motors, such as a gasoline engine and an electric motor.

Energy source 119 represents a source of energy that may, in full or in part, power one or more systems of vehicle 100 (e.g., engine/motor 118). For instance, energy source 119 can correspond to gasoline, diesel, other petroleum-based fuels, propane, other compressed gas-based fuels, ethanol, solar panels, batteries, and/or other sources of electrical power. In some implementations, energy source 119 may include a combination of fuel tanks, batteries, capacitors, and/or flywheel.

Transmission 120 may transmit mechanical power from the engine/motor 118 to wheels/tires 121 and/or other possible systems of vehicle 100. As such, transmission 120 may include a gearbox, a clutch, a differential, and a drive shaft, among other possible components. A drive shaft may include axles that connect to one or more wheels/tires 121.

Wheels/tires 121 of vehicle 100 may have various configurations within example implementations. For instance, vehicle 100 may exist in a unicycle, bicycle/motorcycle, tricycle, or car/truck four-wheel format, among other possible configurations. As such, wheels/tires 121 may connect to vehicle 100 in various ways and can exist in different materials, such as metal and rubber.

Sensor system 104 can include various types of sensors, such as Global Positioning System (GPS) 122, inertial measurement unit (IMU) 124, one or more radar units 126, laser rangefinder/LIDAR unit 128, camera 130, steering sensor 123, and throttle/brake sensor 125, among other possible sensors. In some implementations, sensor system 104 may also include sensors configured to monitor internal systems of the vehicle 100 (e.g., $O_2$ monitors, fuel gauge, engine oil temperature, condition of brakes).

GPS 122 may include a transceiver operable to provide information regarding the position of vehicle 100 with respect to the Earth. IMU 124 may have a configuration that uses one or more accelerometers and/or gyroscopes and may sense position and orientation changes of vehicle 100 based on inertial acceleration. For example, IMU 124 may detect a pitch and yaw of the vehicle 100 while vehicle 100 is stationary or in motion.

Radar unit 126 may represent one or more systems configured to use radio signals to sense objects (e.g., radar signals), including the speed and heading of the objects, within the local environment of vehicle 100. As such, radar unit 126 may include one or more radar units equipped with one or more antennas configured to transmit and receive radar signals as discussed above. In some implementations, radar unit 126 may correspond to a mountable radar system configured to obtain measurements of the surrounding environment of vehicle 100. For example, radar unit 126 can include one or more radar units configured to couple to the underbody of a vehicle.

Laser rangefinder/LIDAR 128 may include one or more laser sources, a laser scanner, and one or more detectors, among other system components, and may operate in a coherent mode (e.g., using heterodyne detection) or in an incoherent detection mode. Camera 130 may include one or more devices (e.g., still camera or video camera) configured to capture images of the environment of vehicle 100.

Steering sensor 123 may sense a steering angle of vehicle 100, which may involve measuring an angle of the steering wheel or measuring an electrical signal representative of the angle of the steering wheel. In some implementations, steering sensor 123 may measure an angle of the wheels of the vehicle 100, such as detecting an angle of the wheels with respect to a forward axis of the vehicle 100. Steering sensor 123 may also be configured to measure a combination (or a subset) of the angle of the steering wheel, electrical signal representing the angle of the steering wheel, and the angle of the wheels of vehicle 100.

Throttle/brake sensor 125 may detect the position of either the throttle position or brake position of vehicle 100. For instance, throttle/brake sensor 125 may measure the angle of both the gas pedal (throttle) and brake pedal or may measure an electrical signal that could represent, for instance, the angle of the gas pedal (throttle) and/or an angle of a brake pedal. Throttle/brake sensor 125 may also measure an angle of a throttle body of vehicle 100, which may include part of the physical mechanism that provides modulation of energy source 119 to engine/motor 118 (e.g., a butterfly valve or carburetor). Additionally, throttle/brake sensor 125 may measure a pressure of one or more brake pads on a rotor of vehicle 100 or a combination (or a subset) of the angle of the gas pedal (throttle) and brake pedal, electrical signal representing the angle of the gas pedal (throttle) and brake pedal, the angle of the throttle body, and the pressure that at least one brake pad is applying to a rotor of vehicle 100. In other embodiments, throttle/brake sensor 125 may be configured to measure a pressure applied to a pedal of the vehicle, such as a throttle or brake pedal.

Control system 106 may include components configured to assist in navigating vehicle 100, such as steering unit 132, throttle 134, brake unit 136, sensor fusion algorithm 138, computer vision system 140, navigation/pathing system 142, and obstacle avoidance system 144. More specifically, steering unit 132 may be operable to adjust the heading of vehicle 100, and throttle 134 may control the operating speed of engine/motor 118 to control the acceleration of vehicle 100. Brake unit 136 may decelerate vehicle 100, which may involve using friction to decelerate wheels/tires 121. In some implementations, brake unit 136 may convert kinetic energy of wheels/tires 121 to electric current for subsequent use by a system or systems of vehicle 100.

Sensor fusion algorithm 138 may include a Kalman filter, Bayesian network, or other algorithms that can process data from sensor system 104. In some implementations, sensor fusion algorithm 138 may provide assessments based on incoming sensor data, such as evaluations of individual objects and/or features, evaluations of a particular situation, and/or evaluations of potential impacts within a given situation.

Computer vision system 140 may include hardware and software operable to process and analyze images in an effort to determine objects, environmental objects (e.g., stop lights, road way boundaries, etc.), and obstacles. As such, computer vision system 140 may use object recognition, Structure from Motion (SFM), video tracking, and other algorithms used in computer vision, for instance, to recognize objects, map an environment, track objects, estimate the speed of objects, etc.

Navigation/pathing system 142 may determine a driving path for vehicle 100, which may involve dynamically adjusting navigation during operation. As such, navigation/pathing system 142 may use data from sensor fusion algorithm 138, GPS 122, and maps, among other sources to navigate vehicle 100. Obstacle avoidance system 144 may evaluate potential obstacles based on sensor data and cause systems of vehicle 100 to avoid or otherwise negotiate the potential obstacles.

As shown in FIG. 1, vehicle 100 may also include peripherals 108, such as wireless communication system 146, touchscreen 148, microphone 150, and/or speaker 152. Peripherals 108 may provide controls or other elements for a user to interact with user interface 116. For example, touchscreen 148 may provide information to users of vehicle 100. User interface 116 may also accept input from the user via touchscreen 148. Peripherals 108 may also enable vehicle 100 to communicate with devices, such as other vehicle devices.

Wireless communication system 146 may securely and wirelessly communicate with one or more devices directly or via a communication network. For example, wireless communication system 146 could use 3G cellular communication, such as CDMA, EVDO, GSM/GPRS, or 4G cellular communication, such as WiMAX or LTE. Alternatively, wireless communication system 146 may communicate with a wireless local area network (WLAN) using WiFi or other possible connections. Wireless communication system 146 may also communicate directly with a device using an infrared link, Bluetooth, or ZigBee, for example. Other wireless protocols, such as various vehicular communication systems, are possible within the context of the disclosure. For example, wireless communication system 146 may include one or more dedicated short-range communications (DSRC) devices that could include public and/or private data communications between vehicles and/or roadside stations.

Vehicle 100 further includes power supply 110 for powering components. Power supply 110 may include a rechargeable lithium-ion or lead-acid battery in some implementations. For instance, power supply 110 may include one or more batteries configured to provide electrical power. Vehicle 100 may also use other types of power supplies. In an example implementation, power supply 110 and energy source 119 may be integrated into a single energy source.

Vehicle 100 may also include computer system 112 to perform operations, such as operations described therein. As such, computer system 112 may include at least one processor 113 (which could include at least one microprocessor) operable to execute instructions 115 stored in a non-transitory computer readable medium, such as data storage 114. In some implementations, computer system 112 may represent a plurality of computing devices that may serve to control individual components or subsystems of vehicle 100 in a distributed fashion.

In some implementations, data storage 114 may contain instructions 115 (e.g., program logic) executable by processor 113 to execute various functions of vehicle 100, including those described above in connection with FIG. 1. Data storage 114 may contain additional instructions as well, including instructions to transmit data to, receive data from, interact with, and/or control one or more of propulsion system 102, sensor system 104, control system 106, and peripherals 108.

In addition to instructions 115, data storage 114 may store data such as roadway maps, path information, among other information. Such information may be used by vehicle 100 and computer system 112 during the operation of vehicle 100 in the autonomous, semi-autonomous, and/or manual modes.

Vehicle 100 may include user interface 116 for providing information to or receiving input from a user of vehicle 100. User interface 116 may control or enable control of content and/or the layout of interactive images that could be displayed on touchscreen 148. Further, user interface 116 could include one or more input/output devices within the set of peripherals 108, such as wireless communication system 146, touchscreen 148, microphone 150, and speaker 152.

Computer system 112 may control the function of vehicle 100 based on inputs received from various subsystems (e.g., propulsion system 102, sensor system 104, and control system 106), as well as from user interface 116. For example, computer system 112 may utilize input from sensor system 104 in order to estimate the output produced by propulsion system 102 and control system 106. Depending upon the embodiment, computer system 112 could be operable to monitor many aspects of vehicle 100 and its subsystems. In some embodiments, computer system 112 may disable some or all functions of the vehicle 100 based on signals received from sensor system 104.

The components of vehicle 100 could be configured to work in an interconnected fashion with other components within or outside their respective systems. For instance, in an example embodiment, camera 130 could capture a plurality of images that could represent information about a state of an environment of vehicle 100 operating in an autonomous mode. The state of the environment could include parameters of the road on which the vehicle is operating. For example, computer vision system 140 may be able to recognize the slope (grade) or other features based on the plurality of images of a roadway. Additionally, the combination of GPS 122 and the features recognized by computer vision system 140 may be used with map data stored in data storage 114 to determine specific road parameters. Further, radar unit 126 may also provide information about the surroundings of the vehicle.

In other words, a combination of various sensors (which could be termed input-indication and output-indication sensors) and computer system 112 could interact to provide an indication of an input provided to control a vehicle or an indication of the surroundings of a vehicle.

In some embodiments, computer system 112 may make a determination about various objects based on data that is provided by systems other than the radio system. For example, vehicle 100 may have lasers or other optical sensors configured to sense objects in a field of view of the vehicle. Computer system 112 may use the outputs from the various sensors to determine information about objects in a field of view of the vehicle, and may determine distance and direction information to the various objects. Computer system 112 may also determine whether objects are desirable or undesirable based on the outputs from the various sensors. In addition, vehicle 100 may also include telematics control unit (TCU) 160. TCU 160 may enable vehicle connectivity and internal passenger device connectivity through one or more wireless technologies.

Although FIG. 1 shows various components of vehicle 100, i.e., wireless communication system 146, computer system 112, data storage 114, and user interface 116, as being integrated into the vehicle 100, one or more of these components could be mounted or associated separately from vehicle 100. For example, data storage 114 could, in part or in full, exist separate from vehicle 100. Thus, vehicle 100 could be provided in the form of device elements that may be located separately or together. The device elements that make up vehicle 100 could be communicatively coupled together in a wired and/or wireless fashion.

FIGS. 2A, 2B, 2C, 2D, and 2E illustrate different views of a physical configuration of vehicle 100. The various views are included to depict example sensor positions 202, 204, 206, 208, 210 on vehicle 100. In other examples, sensors can have different positions on vehicle 100. Although vehicle 100 is depicted in FIGS. 2A-2E as a van, vehicle 100 can have other configurations within examples, such as a truck, a car, a semi-trailer truck, a motorcycle, a bus, a shuttle, a golf cart, an off-road vehicle, robotic device, or a farm vehicle, among other possible examples.

As discussed above, vehicle 100 may include sensors coupled at various exterior locations, such as sensor positions 202-210. Vehicle sensors include one or more types of sensors with each sensor configured to capture information from the surrounding environment or perform other operations (e.g., communication links, obtain overall positioning information). For example, sensor positions 202-210 may serve as locations for any combination of one or more cameras, radar units, LIDAR units, range finders, radio devices (e.g., Bluetooth and/or 802.11), and acoustic sensors, among other possible types of sensors.

When coupled at the example sensor positions 202-210 shown in FIGS. 2A-2E, various mechanical fasteners may be used, including permanent or non-permanent fasteners. For example, bolts, screws, clips, latches, rivets, anchors, and other types of fasteners may be used. In some examples, sensors may be coupled to the vehicle using adhesives. In further examples, sensors may be designed and built as part of the vehicle components (e.g., parts of the vehicle mirrors).

In some implementations, one or more sensors may be positioned at sensor positions 202-210 using movable mounts operable to adjust the orientation of one or more sensors. A movable mount may include a rotating platform that can rotate sensors so as to obtain information from multiple directions around vehicle 100. For instance, a sensor located at sensor position 202 may use a movable mount that enables rotation and scanning within a particular range of angles and/or azimuths. As such, vehicle 100 may include mechanical structures that enable one or more sensors to be mounted on top the roof of vehicle 100. Additionally, other mounting locations are possible within examples. In some situations, sensors coupled at these locations can provide data that can be used by a remote operator to provide assistance to vehicle 100.

Figure 3:
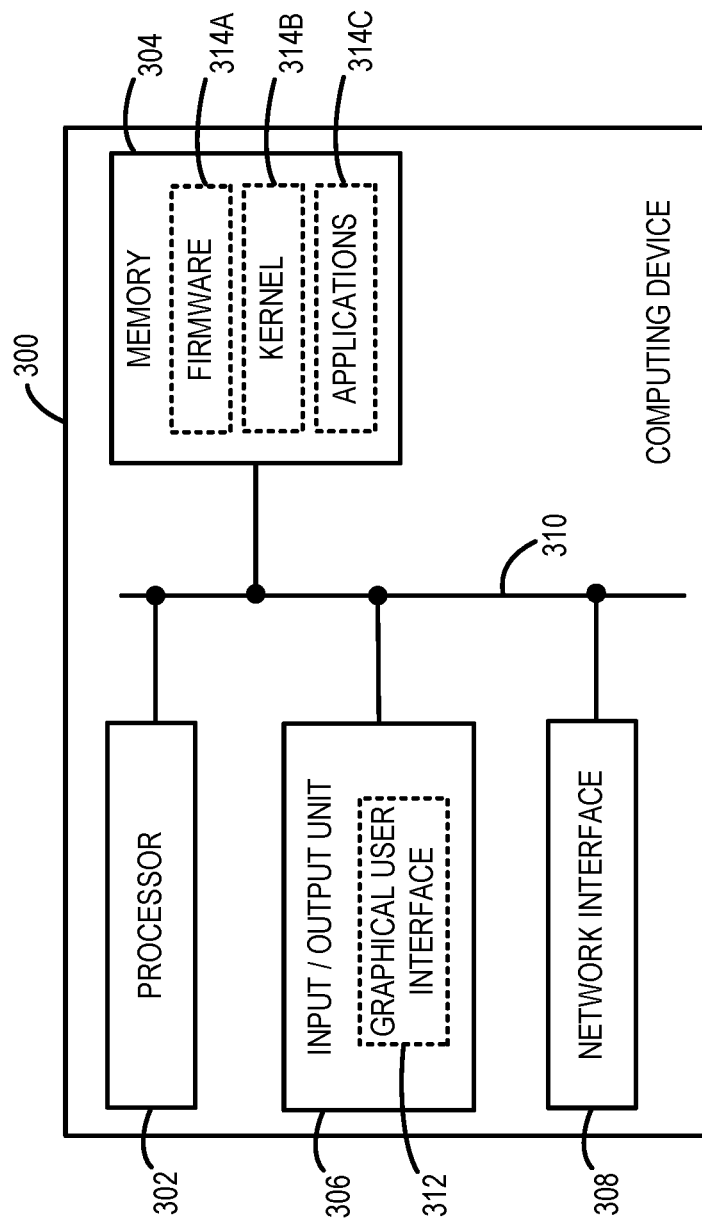
FIG. 3 is a simplified block diagram for a computing system, according to one or more example embodiments.

FIG. 3 is a simplified block diagram exemplifying computing device 300, illustrating some of the components that could be included in a computing device arranged to operate in accordance with the embodiments herein. Computing device 300 could be a client device (e.g., a device actively operated by a user (e.g., a remote operator)), a server device (e.g., a device that provides computational services to client devices), or some other type of computational platform.

In some embodiments, computing device 300 may be implemented as computer system 112, which can be located on vehicle 100 and perform processing operations related to vehicle operations. For example, computing device 300 can be used to process sensor data received from sensor system 104, develop control instructions, enable wireless communication with other devices, and/or perform other operations. Alternatively, computing device 300 can be located remotely from vehicle 100 and communicate via secure wireless communication. For example, computing device 300 may operate as a remotely positioned device that a remote human operator can use to communicate with one or more vehicles.

In the example embodiment shown in FIG. 3, computing device 300 includes processor 302, memory 304, input/output unit 306 and network interface 308, all of which may be coupled by a system bus 310 or a similar mechanism. In some embodiments, computing device 300 may include other components and/or peripheral devices (e.g., detachable storage, sensors, and so on).

Processor 302 may be one or more of any type of computer processing element, such as a central processing unit (CPU), a co-processor (e.g., a mathematics, graphics, or encryption co-processor), a digital signal processor (DSP), a network processor, and/or a form of integrated circuit or controller that performs processor operations. In some cases, processor 302 may be one or more single-core processors. In other cases, processor 302 may be one or more multi-core processors with multiple independent processing units. Processor 302 may also include register memory for temporarily storing instructions being executed and related data, as well as cache memory for temporarily storing recently-used instructions and data.

Memory 304 may be any form of computer-usable memory, including but not limited to random access memory (RAM), read-only memory (ROM), and non-volatile memory. This may include flash memory, hard disk drives, solid state drives, rewritable compact discs (CDs), rewritable digital video discs (DVDs), and/or tape storage, as just a few examples. Computing device 300 may include fixed memory as well as one or more removable memory units, the latter including but not limited to various types of secure digital (SD) cards. Thus, memory 304 can represent both main memory units, as well as long-term storage. Other types of memory may include biological memory.

Memory 304 may store program instructions and/or data on which program instructions may operate. By way of example, memory 304 may store these program instructions on a non-transitory, computer-readable medium, such that the instructions are executable by processor 302 to carry out any of the methods, processes, or operations disclosed in this specification or the accompanying drawings.

As shown in FIG. 3, memory 304 may include firmware 314A, kernel 314B, and/or applications 314C. Firmware 314A may be program code used to boot or otherwise initiate some or all of computing device 300. Kernel 314B may be an operating system, including modules for memory management, scheduling and management of processes, input/output, and communication. Kernel 314B may also include device drivers that allow the operating system to communicate with the hardware modules (e.g., memory units, networking interfaces, ports, and busses), of computing device 300. Applications 314C may be one or more user-space software programs, such as web browsers or email clients, as well as any software libraries used by these programs. In some examples, applications 314C may include one or more neural network applications and other deep learning-based applications. Memory 304 may also store data used by these and other programs and applications.

Input/output unit 306 may facilitate user and peripheral device interaction with computing device 300 and/or other computing systems. Input/output unit 306 may include one or more types of input devices, such as a keyboard, a mouse, one or more touch screens, sensors, biometric sensors, and so on. Similarly, input/output unit 306 may include one or more types of output devices, such as a screen, monitor, printer, speakers, and/or one or more light emitting diodes (LEDs). Additionally or alternatively, computing device 300 may communicate with other devices using a universal serial bus (USB) or high-definition multimedia interface (HDMI) port interface, for example. In some examples, input/output unit 306 can be configured to receive data from other devices. For instance, input/output unit 306 may receive sensor data from vehicle sensors.

As shown in FIG. 3, input/output unit 306 includes GUI 312, which can be configured to provide information to a remote operator or another user. GUI 312 may have one or more display interfaces, or another type of mechanism for conveying information and receiving inputs. In some examples, the representation of GUI 312 may differ depending on a vehicle situation. For example, computing device 300 may provide GUI 312 in a particular format, such as a format with a single selectable option for a remote operator to select from.

Network interface 308 may take the form of one or more wireline interfaces, such as Ethernet (e.g., Fast Ethernet, Gigabit Ethernet, and so on). Network interface 308 may also support communication over one or more non-Ethernet media, such as coaxial cables or power lines, or over wide-area media, such as Synchronous Optical Networking (SONET) or digital subscriber line (DSL) technologies. Network interface 308 may additionally take the form of one or more wireless interfaces, such as IEEE 802.11 (WiFi), BLUETOOTH®, global positioning system (GPS), or a wide-area wireless interface. However, other forms of physical layer interfaces and other types of standard or proprietary communication protocols may be used over network interface 308. Furthermore, network interface 308 may comprise multiple physical interfaces. For instance, some embodiments of computing device 300 may include Ethernet, BLUETOOTH®, and WiFi interfaces. In some embodiments, network interface 308 may enable computing device 300 to connect with one or more vehicles to allow for remote assistance techniques presented herein.

In some embodiments, one or more instances of computing device 300 may be deployed to support a clustered architecture. The exact physical location, connectivity, and configuration of these computing devices may be unknown and/or unimportant to client devices. Accordingly, the computing devices may be referred to as "cloud-based" devices that may be housed at various remote data center locations. In addition, computing device 300 may enable the performance of embodiments described herein, including radar image video compression techniques.

Figure 4:
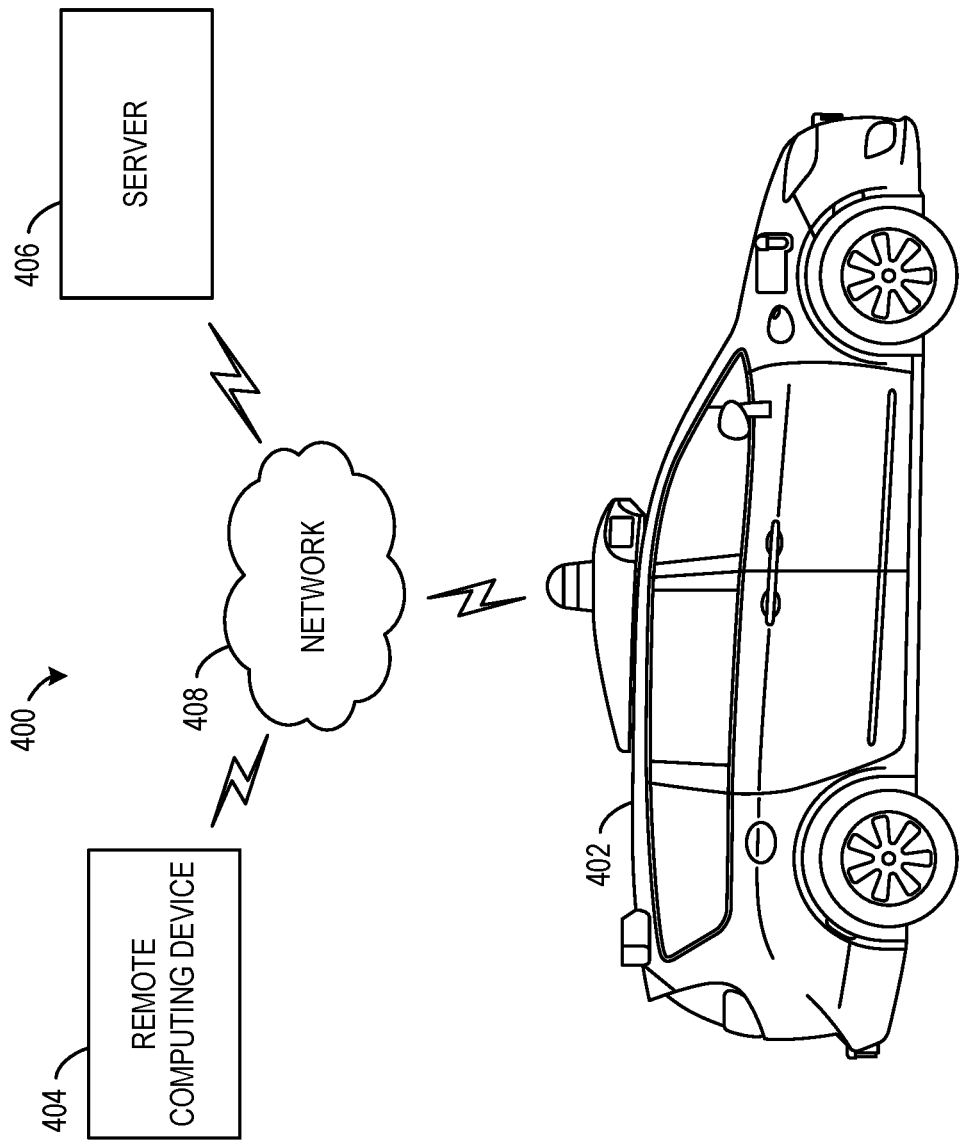
FIG. 4 is a system for wireless communication between a vehicle and computing devices, according to one or more example embodiments.

FIG. 4 is a system for wireless communication between computing devices and a vehicle, according to one or more example embodiments. Particularly, system 400 is shown with vehicle 402, remote computing device 404, and server 406 communicating wirelessly via network 408. System 400 may include other components not shown within other embodiments, such as firewalls and multiple networks, among others.

Vehicle 402 may be configured to autonomously (or semi-autonomously) transport passengers or objects (e.g., cargo) between multiple locations and may take the form of any one or more of the vehicles discussed above, including passenger vehicles, cargo shipping vehicles (e.g., trucks), farming and manufacturing vehicles, and dual-purpose vehicles. When operating in autonomous mode, vehicle 402 may navigate to pick up and drop off passengers (or cargo) between desired destinations by relying on sensor measurements to detect and understand the surrounding environment. In some embodiments, vehicle 402 can operate as part of a fleet, which may be managed by a central system (e.g., remote computing device 404 and/or other computing devices).

Remote computing device 404 may represent any type of device or devices configured to perform operations, including but not limited to those described herein. The position of remote computing device 404 relative to vehicle 402 can vary within examples. For instance, remote computing device 404 may have a remote position from vehicle 402, such as operating inside a physical building. In some implementations, operations described herein that are performed by remote computing device 404 may be additionally or alternatively performed by vehicle 402 (i.e., by any system(s) or subsystem(s) of vehicle 200).

In addition, operations described herein can be performed by any of the components communicating via network 408. For instance, remote computing device 404 may determine a route and/or operations for vehicle 402 to execute using information from vehicle 402 and/or other external sources (e.g., server 406). In some embodiments, remote computing device 404 may generate a GUI to display one or more selectable options for review by a remote operator.

Server 406 may be configured to wirelessly communicate with remote computing device 404 and vehicle 402 via network 408 (or perhaps directly with remote computing device 404 and/or vehicle 402). As such, server 406 may represent any computing device configured to receive, store, determine, and/or send information relating to vehicle 402 and the remote assistance thereof. Server 406 may be configured to perform any operation(s), or portions of such operation(s), that is/are described herein as performed by remote computing device 404 and/or vehicle 402. Some implementations of wireless communication related to remote assistance may utilize server 406, while others may not.

Network 408 represents infrastructure that can enable wireless communication between computing devices, such as vehicle 402, remote computing device 404, and server 406. For example, network 408 can correspond to a wireless communication network, such as the Internet or a cellular wireless communication network. The various systems described above may perform various operations. These operations and related features will now be described.

In some embodiments, vehicle 402 may communicate with remote computing device 404 and/or server 406 via network 408 to receive and/or provide information, such as compressed radar data files. For example, vehicle 402 may communicate compressed radar data files (e.g., radar log files) generated during navigation to server 406 for storage and subsequent access by other vehicles and/or other computing devices (e.g., remote computing device 404). Server 406 may accumulate radar data from multiple vehicles and use machine learning to develop models based on trends within the radar data.

Vehicle sensor systems generate large amounts of data to enable safe navigation in dynamic environments. Among other types of sensors, vehicle sensor systems often include radar that can be used to measure the positions, orientations, and/or movements of nearby vehicles, bicycles, pedestrians, animals, and other objects encountered during navigation. Radar can also reveal information about other features in the vehicle's surrounding environment, such as the location, arrangement, and position of road boundaries, road conditions (e.g., smooth or bumpy surfaces), weather conditions (e.g., wet or snowy roadways), and the position of traffic signs and signals. In some applications, radar is used to assist a driver controlling the vehicle. For instance, radar may be used to generate alerts for certain situations, such as when the vehicle drifts outside its lane, when the vehicle travels too closely to another vehicle or object, and/or in other ways that can help the driver.

A vehicle radar system can be implemented as a SAR system that can emit signals at a scene of targets and measure the voltage returned from the scene. From these voltages, one or more backscatter values (e.g., radar cross sections (RCS(s))) can be determined with each one representing a measure of how "large" a target (or surface) appears in a radar image. In particular, high RCS values can appear as bright targets, whereas dim targets have low RCS values. In environments encountered by vehicles, buildings, signs, other vehicles, and other objects with rough surfaces can scatter large amounts of signals back toward the radar, which produces high RCS values. Conversely, since the ground is relatively flat, it may scatter a larger portion away from radar units of the vehicle radar system, which results in low RCS measurements for the ground. By obtaining different backscatter values (RCS measurements) for surfaces in the surrounding environment, radar can create 2D images and/or 3D reconstructions of the vehicle's environment that shows positions and arrangement of objects relative to the vehicle.

As a vehicle navigates to a target destination, the vehicle radar system transmits signals sequentially and receives reflections of the signals, which can then be digitized and stored for subsequent processing. Because transmission and subsequent reception occurs at different times, they map to different positions, which enables the ordered combination of received signals to build a virtual aperture that extends further than the physical antenna array's width. As a result, the vehicle radar system can be used to produce 2D and/or 3D reconstructions of the environment.

Figure 5:
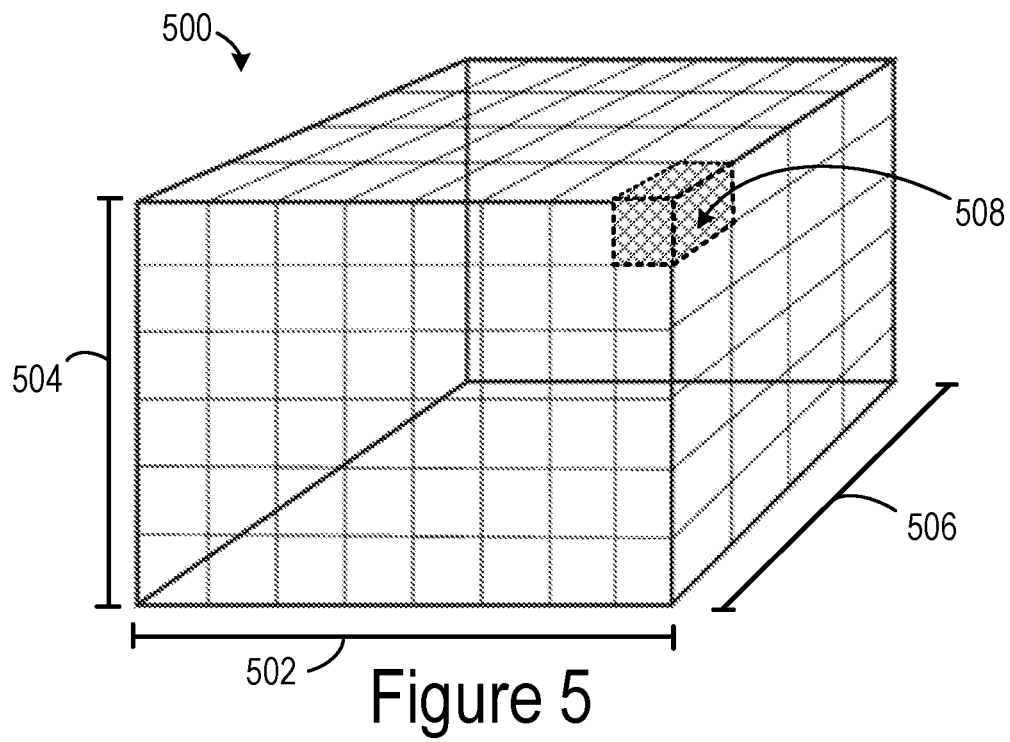
FIG. 5 depicts a three-dimensional (3D) radar data cube, according to one or more example embodiments.

Operations may involve initially defining a 3D mapping of scene elements (e.g., a reconstruction of the environment), which represent the volume of space within which targets exist. Each element of the array can be a cubical voxel (within a radar data cube) representing the probability (a density) of a reflective surface being at that location in space. To further illustrate, FIG. 5 depicts 3D radar data cube 500, which represents information radar hardware collected regarding the scene of the vehicle. In the example embodiment, radar data cube 500 includes cubic voxels arranged to represent range data 502, Doppler data 504, and azimuth data 506 for different surfaces located within the environment.

A FPGA or another processing unit (e.g., computing device 300 shown in FIG. 3) can be used to measure the RCS(Range, Azimuth, Doppler) for a voxel with a set of coordinates (Range, Azimuth, Doppler) and repeat this process for each voxel. For instance, voxel 508 may convey a measured RCS and Doppler score for the surface located at a particular range and azimuth relative to the vehicle. RCS measurements can be determined in parallel for the voxels within radar data cube 500.

Initially, each voxel within radar data cube 500 representing a radar's field of view may have a density of zero. For each captured waveform, the entire volume can be iterated and, for a given waveform and voxel, the distance from the position represented by that voxel to the antenna or antennas used to capture that waveform is calculated with the distance representing a time delay into the waveform. The sample value at that position in the waveform can then be added to the voxel's density value, which represents a possible echo from a target at that position. Note there can be several optional approaches here, depending on the precision of the waveform timing, among other things. For example, if phase cannot be accurately determined, the envelope magnitude (with the help of a Hilbert transform) of the waveform sample might be added to the voxel. If waveform polarization and phase are known and are accurate enough, then these values might be added to a more complex voxel that holds such measurements separately. After all waveforms have been iterated over all voxels, the basic SAR processing may be complete.

After performing the above processes, the vehicle radar system may decide what voxel density value represents a solid object. As such, voxels representing power density below a power threshold may be ignored. The threshold should be higher than the peak energy of any signal wave to prevent the wave peak from appearing as a sphere (or ellipse, in the case of multistatic operation) of false "density" across the entire volume. Thus, to detect a point on a target, at least two different antenna echoes from that point may be used which may lead to radar units using large numbers of antennas to properly characterize a target object. The voxels that passed the threshold criteria can be visualized in 2D or 3D. Optionally, added visual quality may be added by using a surface detection algorithm like marching cubes.

Range bins are a scheme in which a digital radar uses a set of range gates to chop up the return trace into segments and sum the value for each segment into an associated memory "bin". By using memory bins, the vehicle radar system or another processing unit (e.g., FPGA or computing device 300) can inspect the bins to see where a target is along the trace and track the target's range. The processing unit can also sum up values from trace to trace relative to an average level and, since noise will tend to fluctuate around the average level, the contents of most of the range bins may remain at the average level. As such, the vehicle radar system can keep track of the average noise level in the range bins and adjust the noise threshold accordingly, a scheme known as "constant false alarm rate (CFAR)". When there is a return signal in a range bin, the signal can tend to add up over time, which makes it easier to differentiate from the noise. If the signal shows up in two or more adjacent bins, the radar can also interpolate between the two to get a more accurate range estimate.

The period of time during which a radar unit transmits a sequence of pulses (e.g., each with the same predetermined carrier frequency and predetermined pulse repetition frequency (PRF)) and then receives a corresponding return signal comprised of one or more pulses is referred to herein as a coherent processing interval (CPI). In some examples, all of the pulses of the sequence can be transmitted at the same angle, but in other examples, multiple groups of pulses can be transmitted at different angles. The length of a CPI can vary, and in one example can be selected to be a value in a range of 20-30 milliseconds (e.g., 25 milliseconds).

The vehicle radar system can process the return signal of each CPI (e.g., using digital signal processing). For example, the vehicle radar system can process the return signal for a given CPI to generate range-Doppler data (also known as a range-Doppler map or a range-Doppler matrix), which can include estimates of both range and velocity of potential targets and can thus be used for target detection and tracking. That is, range-Doppler data can take the form of arrays or other data structures that facilitate an evaluation of signal strength (or another parameter related to signal strength) as a function of target range and Doppler (e.g., velocity). In some examples, range-Doppler data can be represented in three-dimensions.

The range-Doppler data for various CPIs can be expressed as a series of signal strengths (or related parameters) corresponding to respective range-Doppler bins. For example, in processing a return signal for a given CPI to generate range-Doppler data, the vehicle radar system can sample and then divide and store the return signal into a plurality of range bins, each range bin representing a segment of range values and having a corresponding signal strength. The data within each range bin can then be further processed (e.g., using Doppler filters) to generate a plurality of Doppler bins corresponding to the range bin, where each Doppler bin corresponds to a signal from a target or other part of the environment at a given range moving at a given velocity. Thus, the resulting range-Doppler data for that CPI can be made up of a plurality of range-Doppler bins, each range-Doppler bin having a range bin index, a Doppler bin index, and a corresponding signal strength. In other words, the range-Doppler data can show the amplitude of returns from stationary targets (at zero Doppler) and moving targets (at nonzero Doppler) as a function of both range and velocity.

As an example, the range-Doppler data can include 400 range bins, each having a corresponding 100 Doppler bins, and each range-Doppler bin can be represented by RD, where R is a range index value from 1 to 400 and D is a Doppler index value from 1 to 100 (e.g., $1_1, 1_2, \ldots 1_{100}, 2_1, 2_2, \ldots 2_{100}, \ldots 400_1, 400_2, \ldots 400_{100}$). In this example, each group of bins having the same range index (e.g., $1_1, 1_2, \ldots 1_{100}$) can be referred to as a "range slice" of the range-Doppler data and each group of bins having the same Doppler index (e.g., $1_{100}, 2_{100}, \ldots 400_{100}$) can be referred to as a "Doppler slice" of the range-Doppler data. Other examples are possible as well, as well as other example forms that range-Doppler data can take.

Furthermore, the vehicle radar system can similarly generate three dimensions of data—namely, range-Doppler-angle data—such as by using a series of Fast Fourier Transforms (FFTs). The range-Doppler-angle data can be filtered and binned using angle filters and measurements, and then indexed similarly to the range-Doppler data described above, albeit in three dimensions instead of two. In addition, range-Doppler-angle data can take the form of a range-Doppler-angle map, which can be a 3D image with range, Doppler, and angle coordinates/bins. In some cases, a bin of a range-Doppler-angle map can be referred to as a pixel of the map. As discussed in more detail below, both range-Doppler data and range-Doppler-angle data can be used in performing the disclosed operations.

Figure 6:
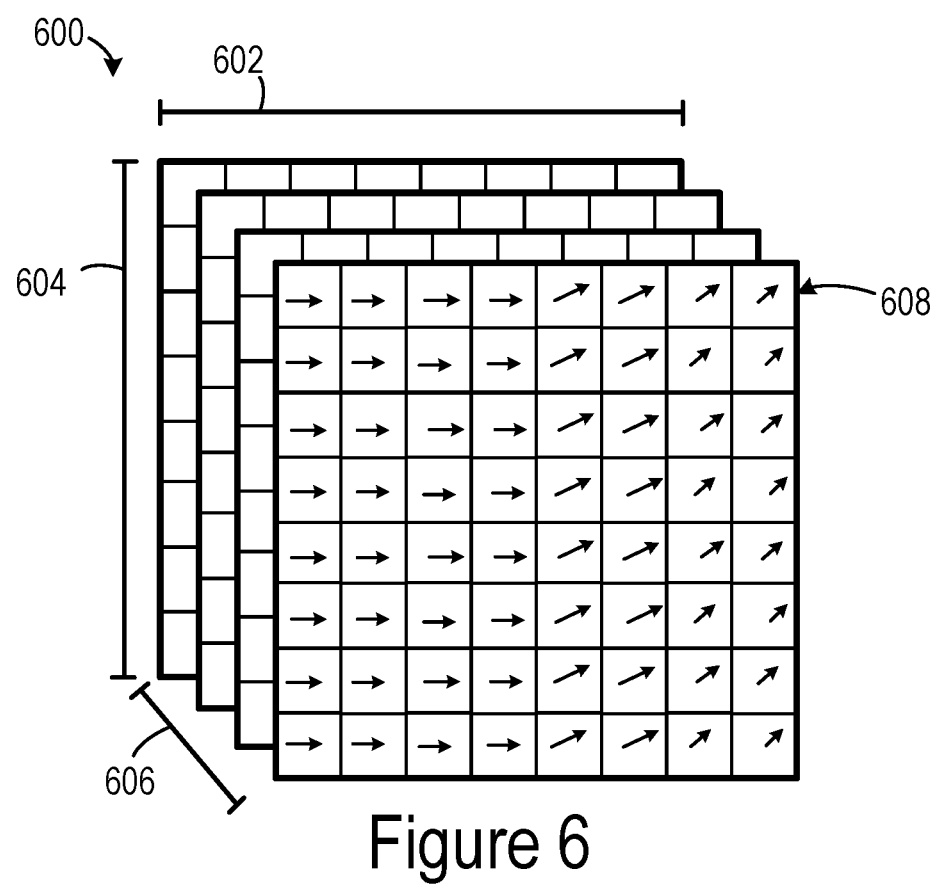
FIG. 6 depicts two-dimensional (2D) radar images, according to one or more example embodiments.

In some instances, 2D images are used rather than 3D mapping to decrease computational resources required. As an example, FIG. 6 depicts 2D radar images 600. Radar images 600 can be used to convey the information captured in radar data cube 500 shown in FIG. 5 in a 2D configuration. During radar operation, a FPGA and/or a computing device may generate radar images 600 based on received radar data. Radar images 600 can represent a projection along one axis of radar data cube 500. For instance, the FPGA and/or computing device may aggregate out one dimension by taking the max power of all of the voxels (or a subset of the voxels) mapping to a projected pixel. In addition, the aggregate max can also be determined and recorded to cause each image to include two raw channels.

In the example shown in FIG. 6, range is represented in radar images 600 by vertical arrow 604 shown extending down from axis origin 602 and Doppler/azimuth can be represented in radar images 600 by horizontal arrow 606 extending away from axis origin 602. For example, radar image 606 may represent a Doppler channel indicating Doppler scores 614 arranged according to range and azimuth and radar image 608 may represent a backscatter channel indicating backscatter values arranged according to range and azimuth. Each pixel in the backscatter channel can represent the radar backscatter received from a particular surface in the environment. Brighter areas can represent high backscatter and darker areas can represent low backscatter. Similarly, the Doppler channel indicates per-pixel Doppler scores that can be used to predict backscatter pixels for a following image.

In addition, radar image 610 can represent an azimuth channel indicating azimuth data arranged according to range and Doppler and radar image 612 can represent a backscatter channel indicating backscatter values arranged according to range and Doppler. As shown, the two image channels are backscatter providing range information and azimuth information (e.g., the single azimuth with maximal backscatter).

In some examples, the FPGA and/or computing device can be configured to use a range-Doppler 2D fast Fourier transform (FFT) sensor signal process in combination with a 3rd FFT along the receive channels for azimuth estimation and peak estimation. The FPGA and/or the computing device may also be configured to use a Range-azimuth 2D FFT sensor signal process in combination with a 3rd FFT for motion estimation in frequency domain and peak estimation.

During vehicle operation, incoming radar data can be converted into radar images 600. Over time, this creates a sequential series of image frames (e.g., radar images 606-612) resulting in a radar video stream that can be used to track and monitor different objects in the environment. Disclosed radar data compression techniques can be used to compress the radar video to enable efficient storage and communication of the data with other computing devices.

Figure 7:
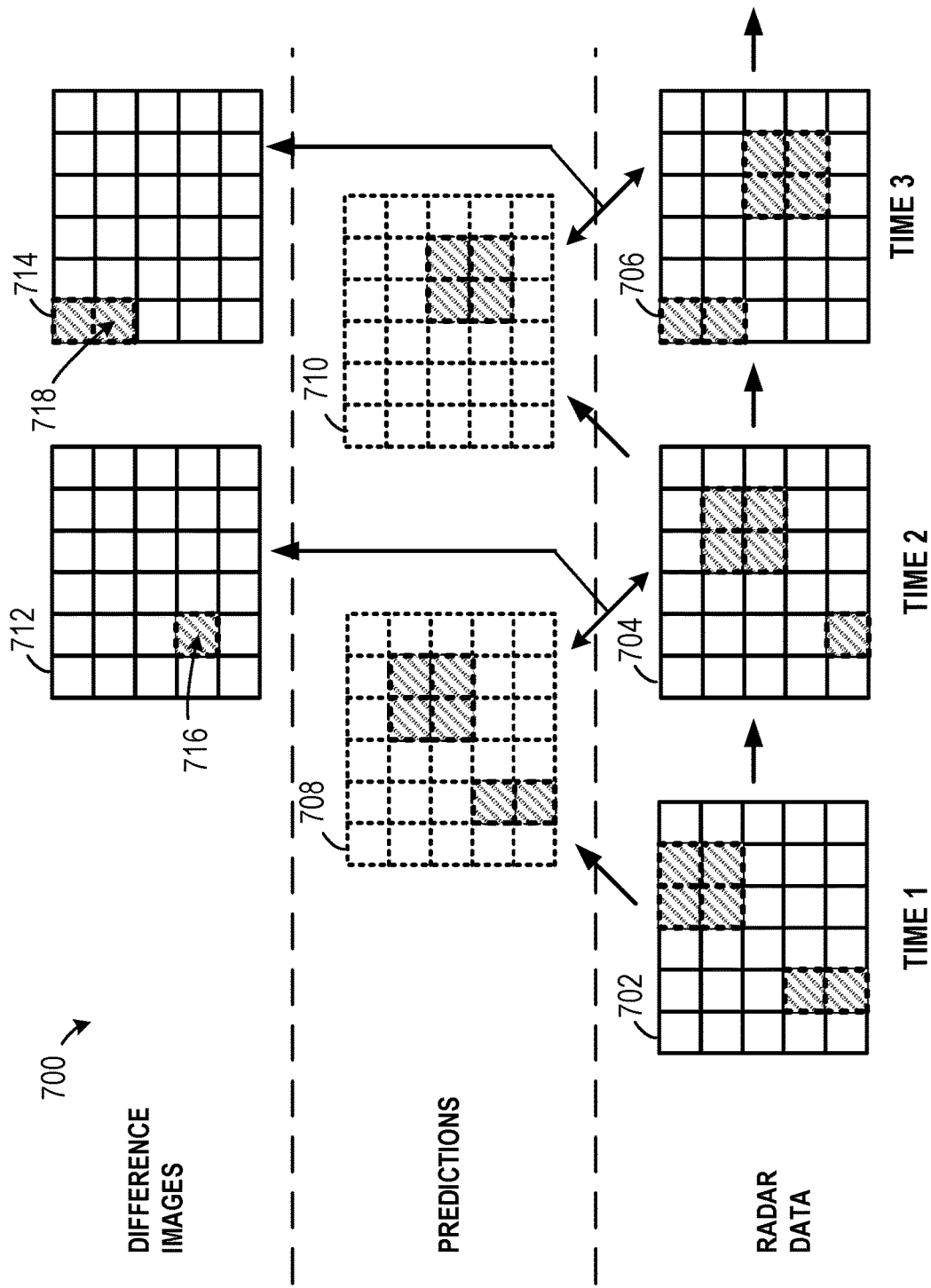
FIG. 7 depicts a visual representation of a system for implementing radar image video compression, according to one or more example embodiments.

FIG. 7 depicts a visual representation of a system for implementing radar image video compression. In the example embodiment, system 700 is shown with three groups (radar data, predictions, and difference images), which are used to illustrate different aspects of disclosed radar video compression techniques. System 700 can be implemented via one or more computing devices, such as computing system 112 shown in FIG. 1, computing device 300 shown in FIG. 3, and/or remote computing device 404 shown in FIG. 4.

In some embodiments, one or more field FPGAs can implement system 700 or a portion of system 700. For example, each radar unit positioned on a vehicle can include one or more FPGAs configured to perform one or more radar image video compression operations, which can reduce the amount of data that is communicated from each FPGA to other processing units on the vehicle, such as a central processing unit for the vehicle radar system and/or vehicle control systems.

The radar data group represents incoming radar data received by one or more radar units and is shown with radar image 702, radar image 704, and radar image 706. These radar images are shown in a simplified version for illustration purposes (e.g., only 30 pixels), but can include any quantity of pixels arranged to represent information about surfaces in the environment. As such, radar images 702-706 collectively represent a portion of radar video that can be generated during navigation to detect objects in the surrounding environment. In particular, radar image 702 may represent a first frame of radar data at time 1, radar image 704 may represent a second frame of radar data at time 2, and radar image 706 represents a third frame of radar data at time 3. The radar video stream produced using radar from a radar unit can include hundreds, thousands, etc. frames of radar data collected and produced across time as the vehicle navigates.

In some examples, radar images 702-706 may be range-Doppler images that provide range and Doppler information for surfaces in the environment and express azimuth across sequential images. In other examples, radar images 702-706 may be range-azimuth images that express Doppler scores across sequential images. In other examples, different types of representations can be used, such as radar data cube 500 shown in FIG. 5.

System 700 further shows predictions, which each represent a prediction of the next radar image based on the prior radar image and Doppler information within that prior radar image. Particularly, a FPGA or another processing system may predict changes for pixels from one radar image to the next radar image based on Doppler information within the current radar image. In some instances, vehicle motion (e.g., yaw rate and/or velocity) may be used to help predict the changes.

To illustrate the prediction process, system 700 shows that radar image 702 may be used to estimate radar prediction 708. In particular, radar prediction 708 represents how pixels within radar image 704 may likely appear based on Doppler information within radar image 702. Doppler information for each pixel within radar image 702 can be used to determine a range rate for the pixel. The range rate for each pixel can indicate the motion of the represented surface in the radial direction toward the receiving radar unit (or away from the receiving radar unit). As a result, range rates for all the pixels in radar image 702 (or a subset of the pixels) can be used to estimate radar prediction 708.

When radar image 704 becomes available (e.g., generated by a FPGA), system 700 further shows that the FPGA or processing unit may compare radar prediction 708 with radar image 704 to determine difference image 712. Difference image 712 represents differences between pixels within radar prediction 708 relative to the actual pixels within radar image 704. In the example shown, difference image 712 includes pixel difference 716 representing the variance between radar prediction 708 and radar image 704. Because difference image 712 likely includes relatively minimal differences and thus less information overall, the FPGA or processing unit may efficiently compress difference image 712 rather than compressing the information within radar images 702-706. In some examples, difference image 712 may represent two channels of information, such as a Doppler channel and a backscatter value channel. In other examples, difference image 712 may represent two channels involving a backscatter value channel and an azimuth channel.

System 700 further shows that the above process can be repeated iteratively to enable compressing differences between predictions and actual radar images. For instance, after generation of radar image 704, the FPGA or the processing unit may similarly estimate radar prediction 710, which represents an estimation for the next radar image (i.e., radar image 706). Particularly, radar prediction 710 can be estimated based on pixels in radar image 704, including backscatter values and range rates determined for each pixel based on the Doppler score for that pixel in radar image 704. Radar prediction 710 can thus serve as a prediction of changes between radar image 704 and radar image 706 and may convey two channels of information, such as backscatter value and Doppler scores that represent the changes between radar image 704 and radar image 706.

Radar prediction 710 and radar image 706 can then be compared to generate difference image 714, which then can be efficiently compressed and compiled with compressed difference image 712. As shown, pixel difference 718 in difference image 714 represents the variance between radar prediction 710 and radar image 706. As such, difference images 712-714 generated by iteratively performing the above process can be compiled together and compressed in a continuous manner. Alternatively, difference images can be compiled together and periodically compressed cyclically, such as every 10 seconds, one minute, 10 minutes, etc.

Figure 8:
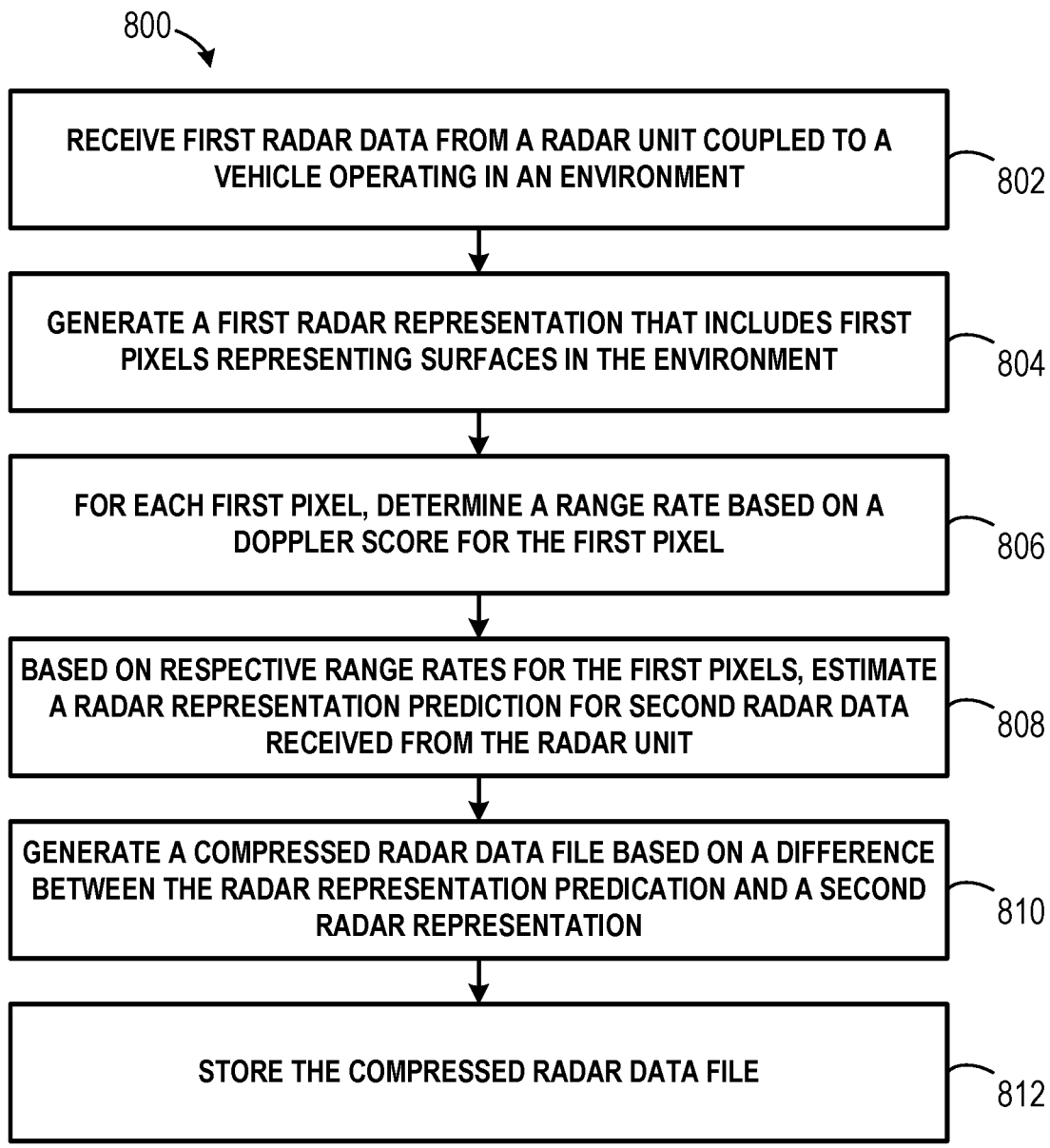
FIG. 8 is a flow chart of a method for performing radar image video compression using per-pixel Doppler measurements for partial frame prediction, according to one or more example embodiments.

FIG. 8 is a flow chart of a method for radar image video compression that uses per-pixel Doppler measurements for partial frame prediction, according to one or more example embodiments. Method 800 may include one or more operations, functions, or actions, as depicted by one or more of blocks 802, 804, 806, 808, 810, and 812, each of which may be carried out by any of the systems shown in prior figures, among other possible systems.

Those skilled in the art will understand that the flow charts described herein illustrate functionality and operation of certain implementations of the present disclosure. In this regard, each block of the flowchart may represent a module, a segment, or a portion of program code, which includes one or more instructions executable by one or more processors for implementing specific logical functions or steps in the process. The program code may be stored on any type of computer readable medium, for example, such as a storage device including a disk or hard drive.

In addition, each block may represent circuitry that is wired to perform the specific logical functions in the process. Alternative implementations are included within the scope of the example implementations of the present application in which functions may be executed out of order from that shown or discussed, including substantially concurrent or in reverse order, depending on the functionality involved, as would be understood by those reasonably skilled in the art.

One or more computing devices can perform blocks of method 800. For example, a combination of one or more field programmable gate arrays (FPGAs) and computing devices may implement method 800 in some examples. A FPGA can be configured to transmit compressed radar data files to a control system of the vehicle, which may store the files and/or decompress the files for use.

At block 802, method 800 involves receiving first radar data from a radar unit coupled to a vehicle operating in an environment. The radar unit can be positioned on the vehicle at various locations within examples. For instance, the radar unit can be a forward facing radar unit coupled to a front portion of the vehicle. In some examples, multiple radar units may simultaneously provide radar data for subsequent processing.

At block 804, method 800 involves generating a first radar representation that includes first pixels representing surfaces in the environment. The first radar representation can be generated based on the first radar data with each first pixel indicating a Doppler score and a backscatter value. In some embodiments, a first range-Doppler image is generated. The 2D range-Doppler image can have the first pixels arranged according to a polar coordinate system.

At block 806, method 800 involves, for each first pixel, determining a range rate based on a Doppler score for the first pixel. The range rate indicates a radial direction motion for a surface represented by the first pixel and can represent a motion toward the vehicle or away from the vehicle in some examples. In some examples, a computing device may cause the radar unit to transmit radar signals according to a particular waveform and transform the Doppler score for a given first pixel into a range rate for the given first pixel based on the particular waveform.

At block 808, method 800 involves estimating a radar representation prediction for second radar data received from the radar unit based on respective range rates and backscatter values for the first pixels. The second radar data is received subsequent to the first radar data.

In some examples, a computing device may estimate a subsequent range for each first pixel based on a range rate and backscatter value determined for the first pixel and generate a range-Doppler image prediction having a set of pixel predictions arranged according to the polar coordinate system. In particular, each pixel prediction can represent the subsequent range for a given first pixel such that the set of pixel predictions collectively represent predicted locations for the surfaces in the environment. The pixel predictions can represent shifts of the backscatter values based on corresponding range rates determined for the pixels.

In some embodiments, the computing device may receive a velocity and a yaw rate for the vehicle from an inertial measurement unit (IMU) and use the velocity and/or yaw rate for the vehicle to estimate the radar representation prediction for second radar data received from the radar unit. The position and motion information for the vehicle can be factored as well as the position and orientation of individual radar units on the vehicle when estimating image predictions for subsequent radar returns.

At block 810, method 800 involves generating a compressed radar data file based on a difference between the radar representation prediction and a second radar representation. The second representation is generated based on the second radar data and includes second pixels representing surfaces in the environment.

In some examples, a computing device may receive the second radar data from the radar unit coupled to the vehicle and generate a second image having second pixels arranged according to the polar coordinate system. The second pixels can similarly represent surfaces in the environment. The computing device can perform a comparison between the second image and the image prediction. Based on the comparison, the computing device can identify respective differences between the second image with each respective difference indicating a range difference between a given second pixel in the image and a corresponding pixel prediction in the image prediction. The respective differences can be compressed to generate the compressed radar data file. The radar images can involve the use of one or both of range-Doppler images and range-azimuth images as shown in FIG. 6.

At block 812, method 800 involves storing the compressed radar data file. In addition, a system may perform machine learning using the compressed radar data file to train a model for use during subsequent navigation of the vehicle. For instance, a system may decompress the compressed data files and perform machine learning using the decompressed radar data files to train a model for use during subsequent operation of the vehicle.

In some cases, a computing device may transmit the compressed radar data file to a remote computing device that can compile compressed radar data files from numerous vehicles. In some examples, a control system may use the compressed radar data file to control the vehicle. For instance, the control system may perform a decompression process on received compressed radar data files to extract and use the radar information when implementing a control strategy of the vehicle.

Some embodiments may involve using radar data cubes. For example, a system may generate a first radar data cube such that the first pixels correspond to first voxels in the first radar data cube, estimate a radar data cube prediction, and generate the compressed radar data file based on a difference between the radar data cube prediction and a second radar data cube corresponding to the second radar data. The comparison may involve comparing prediction voxels in the radar data cube prediction to second voxels in the second radar data cube.

Figure 9:
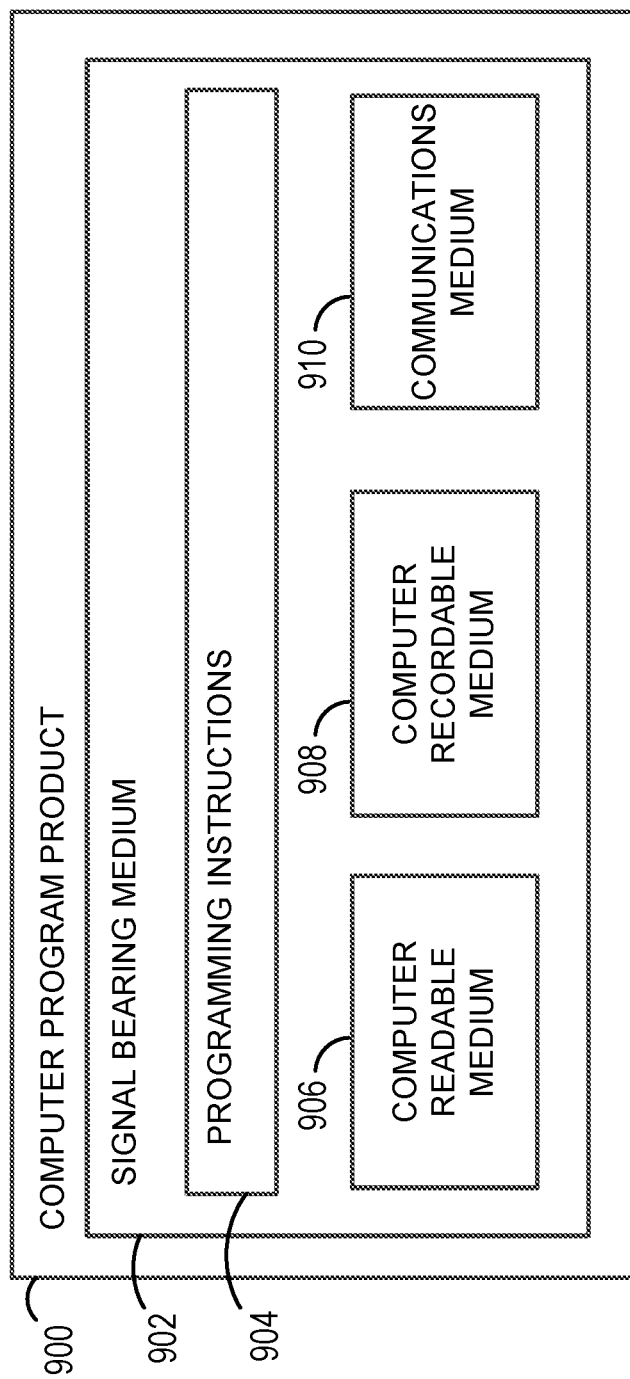
FIG. 9 is a schematic diagram of a computer program, according to one or more example embodiments.

FIG. 9 is a schematic illustrating a conceptual partial view of an example computer program product that includes a computer program for executing a computer process on a computing device, arranged according to at least some embodiments presented herein. In some embodiments, the disclosed methods may be implemented as computer program instructions encoded on a non-transitory computer-readable storage media in a machine-readable format, or on other non-transitory media or articles of manufacture.

In one embodiment, example computer program product 900 is provided using signal bearing medium 902, which may include one or more programming instructions 904 that, when executed by one or more processors may provide functionality or portions of the functionality described above with respect to FIGS. 1-8. In some examples, signal bearing medium 902 may encompass a non-transitory computer-readable medium 906, such as, but not limited to, a hard disk drive, a Compact Disc (CD), a Digital Video Disk (DVD), a digital tape, memory, etc. In some implementations, signal bearing medium 902 may encompass computer recordable medium 908, such as, but not limited to, memory, read/write (R/W) CDs, R/W DVDs, etc. In some implementations, the signal bearing medium 902 may encompass a communications medium 910, such as, but not limited to, a digital and/or an analog communication medium (e.g., a fiber optic cable, a waveguide, a wired communications link, a wireless communication link, etc.). Thus, for example, signal bearing medium 902 may be conveyed by a wireless form of communications medium 910.

The one or more programming instructions 904 may be, for example, computer executable and/or logic implemented instructions. In some examples, a computing device such as the computer system 112 of FIG. 1 may be configured to provide various operations, functions, or actions in response to programming instructions 904 conveyed to the computer system 112 by one or more of computer readable medium 906, computer recordable medium 908, and/or communications medium 910. Other devices may perform operations, functions, or actions described herein.

The non-transitory computer readable medium could also be distributed among multiple data storage elements, which could be remotely located from each other. The computing device that executes some or all of the stored instructions could be a vehicle, such as vehicle 100 illustrated in FIGS. 1-2E. Alternatively, the computing device that executes some or all of the stored instructions could be another computing device, such as a server.

The above detailed description describes various features and functions of the disclosed systems, devices, and methods with reference to the accompanying figures. While various aspects and embodiments have been disclosed herein, other aspects and embodiments will be apparent. The various aspects and embodiments disclosed herein are for purposes of illustration and are not intended to be limiting, with the true scope being indicated by the following claims.

It should be understood that arrangements described herein are for purposes of example only. As such, those skilled in the art will appreciate that other arrangements and other elements (e.g. machines, apparatuses, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

What is claimed is:

1. A method comprising:
    receiving first radar data from a radar unit coupled to a vehicle operating in an environment;
    based on the first radar data, generating, by an on-chip embedded at the radar unit, a first radar representation that includes first pixels representing surfaces in the environment, wherein each first pixel includes a Doppler score and a backscatter value;
    for each first pixel, determining a range rate based on a Doppler score for the first pixel, wherein the range rate indicates a radial direction motion for a surface represented by the first pixel;
    receiving a velocity and a yaw rate for the vehicle from an inertial measurement unit (IMU);
    based on respective range rates and backscatter values for the first pixels and the velocity and the yaw rate for the vehicle, estimating a radar representation prediction for second radar data received from the radar unit, wherein the second radar data is received subsequent to the first radar data;
    determining a difference between the radar representation prediction and a second radar representation generated based on the second radar data, wherein the second radar representation includes second pixels representing surfaces in the environment;
    generating, by the on-chip embedded at the radar unit, a compressed radar data file based on the difference between the radar representation prediction and the second radar representation; and
    transmitting the compressed radar data file to a control system of the vehicle.

2. The method of claim 1, wherein generating the first radar representation comprises:
    generating a first image having the first pixels arranged according to a polar coordinate system.

3. The method of claim 2, wherein estimating the radar representation prediction for second radar data comprises:
    performing a translation in an azimuth dimension of the first image based on the yaw rate of the vehicle; and
    estimating the radar representation prediction for the second radar data based on performing the translation in the azimuth dimension.

4. The method of claim 3, wherein estimating the radar representation prediction for the second radar data comprises:
    estimating a subsequent range for each first pixel based on a corresponding backscatter value and a range rate determined for the first pixel and the velocity and the yaw rate for the vehicle; and
    generating an image prediction having a set of pixel predictions arranged according to the polar coordinate system, wherein each pixel prediction represents the subsequent range for a given first pixel such that the set of pixel predictions collectively represent predicted locations for the surfaces in the environment.

5. The method of claim 4, further comprising:
    receiving the second radar data from the radar unit coupled to the vehicle; and
    generating a second image having second pixels arranged according to the polar coordinate system, wherein the second pixels represent surfaces in the environment.

6. The method of claim 5, wherein generating the compressed radar data file comprises:
    performing a comparison between the second image and the image prediction;
    based on the comparison, identifying respective per-pixel differences between the second image and the image prediction, wherein each respective per-pixel difference indicates a backscatter difference between a given second pixel in the second image and a corresponding pixel prediction in the image prediction; and
    compressing the respective differences to generate the compressed radar data file.

7. The method of claim 6, wherein each respective per-pixel difference further indicates an azimuth difference or a Doppler difference between the given second pixel in the second image and the corresponding pixel prediction in the image prediction.

8. The method of claim 1, further comprising:
    causing the radar unit to transmit radar signals according to a particular waveform; and
    wherein determining the range rate based on the Doppler score for the first pixel comprises:
    transforming the Doppler score for a given first pixel into a range rate for the given first pixel based on the particular waveform.

9. The method of claim 1, further comprising:
    decompressing the compressed radar data file; and
    performing machine learning using the decompressed radar data file to train a model for use during subsequent operation of the vehicle.

10. The method of claim 1, further comprising:
    transmitting the compressed radar data file to a remote computing device, wherein the remote computing device is configured to compile compressed radar data files from a plurality of vehicles.

11. The method of claim 1, further comprising:
    decompressing the compressed radar data file; and
    controlling the vehicle based on the decompressed radar data file.

12. The method of claim 1, wherein generating the first radar representation comprises:
    generating a first radar data cube such that the first pixels correspond to first voxels in the first radar data cube;
    wherein estimating the radar representation prediction for second radar data comprises:
    estimating a radar data cube prediction; and
    wherein generating the compressed radar data file comprises:
    generating the compressed radar data file based on a difference between the radar data cube prediction and a second radar data cube corresponding to the second radar data.

13. The method of claim 1, further comprising:
    determining the yaw rate for the vehicle further based on laser scan matching.

14. A system comprising:
    a radar unit and an inertial measurement unit (IMU) coupled to a vehicle; and
    an on-chip embedded at the radar unit configured to:
    receive first radar data from the radar unit;
    based on the first radar data, generate a first radar representation that includes first pixels representing surfaces in an environment, wherein each first pixel includes a Doppler score and a backscatter value;

for each first pixel, determine a range rate based on a Doppler score for the first pixel, wherein the range rate indicates a radial direction motion for a surface represented by the first pixel;

receive a velocity and a yaw rate for the vehicle from the IMU;

based on respective range rates and backscatter values for the first pixels and the velocity and the yaw rate for the vehicle, estimate a radar representation prediction for second radar data received from the radar unit, wherein the second radar data is received subsequent to the first radar data;

determine a difference between the radar representation prediction and a second radar representation generated based on the second radar data, wherein the second radar representation includes second pixels representing surfaces in the environment;

generate a compressed radar data file based on the difference between the radar representation prediction and the second radar representation; and transmit the compressed radar data file to a control system of the vehicle.

15. The system of claim 14, wherein the first radar representation and the second radar representation are part of a radar video stream.

16. The system of claim 14, wherein the first radar representation is a first image having the first pixels arranged according to a polar coordinate system, and wherein the second radar representation is a second image having second pixels arranged according to the polar coordinate system.

17. The system of claim 16, wherein the on-chip embedded at the radar unit is further configured to:

estimate a subsequent range for each first pixel based on a corresponding backscatter and a range rate determined for the first pixel; and generate the radar representation prediction as an image prediction having a set of pixel predictions arranged according to the polar coordinate system, wherein each pixel prediction represents the subsequent range for a given first pixel such that the set of pixel predictions collectively represent predicted locations for the surfaces in the environment.

18. The system of claim 17, wherein the on-chip embedded at the radar unit is further configured to:

perform a comparison between the image prediction and the second image;

based on the comparison, identify one or more per-pixel differences between the image prediction and the second image, wherein each per-pixel difference indicates a backscatter difference between a given second pixel in the second image and a corresponding pixel prediction in the image prediction, and wherein each per-pixel difference further indicates an azimuth difference or a Doppler difference between the given second pixel in the second image and the corresponding pixel prediction in the image prediction; and compress the one or more differences to generate the compressed radar data file.

19. The system of claim 14, wherein the on-chip embedded at the radar unit is a field programmable gate array (FPGA) configured to further transmit the compressed radar data file to a control system of the vehicle, and wherein the radial direction motion is either toward the vehicle or away from the vehicle.

20. A non-transitory computer-readable medium configured to store instructions, that when executed by a computing system comprising one or more processors, causes the computing system to perform operations comprising:

receiving first radar data from a radar unit coupled to a vehicle operating in an environment;

based on the first radar data, generating a first radar representation that includes first pixels representing surfaces in the environment, wherein each first pixel includes a Doppler score and a backscatter value;

for each first pixel, determining a range rate based on a Doppler score for the first pixel, wherein the range rate indicates a radial direction motion for a surface represented by the first pixel;

receiving a velocity and a yaw rate for the vehicle from an inertial measurement unit (IMU);

based on respective range rates and backscatter values for the first pixels and the velocity and the yaw rate for the vehicle, estimating a radar representation prediction for second radar data received from the radar unit, wherein the second radar data is received subsequent to the first radar data;

determining a difference between the radar representation prediction and a second radar representation generated based on the second radar data, wherein the second radar representation includes second pixels representing surfaces in the environment;

generating a compressed radar data file based on the difference between the radar representation prediction and the second radar representation; and transmitting the compressed radar data file to a control system of the vehicle, wherein the computing system is an on-chip embedded at the radar unit.

* * * * *